US010018831B2

(12) United States Patent
Corbelli et al.

(10) Patent No.: US 10,018,831 B2
(45) Date of Patent: Jul. 10, 2018

(54) METHOD FOR THE PRODUCTION OF STRETCHABLE AND DEFORMABLE OPTICAL ELEMENTS, AND ELEMENTS THUS OBTAINED

(71) Applicants: WISE S.R.L., Milan (IT); Maria Montorfano, Mariano Comense (IT)

(72) Inventors: Gabriele Corbelli, Mariano Comense (IT); Cristian Ghisleri, Soncino (IT); Luca Ravagnan, Milan (IT); Paolo Milani, Pavia (IT)

(73) Assignee: WISE S.R.L., Milan (IT)

( * ) Notice: Subject to any disclaimer, the term of this patent is extended or adjusted under 35 U.S.C. 154(b) by 119 days.

(21) Appl. No.: 14/364,672

(22) PCT Filed: Dec. 5, 2012

(86) PCT No.: PCT/EP2012/074492
§ 371 (c)(1),
(2) Date: Jun. 12, 2014

(87) PCT Pub. No.: WO2013/083624
PCT Pub. Date: Jun. 13, 2013

(65) Prior Publication Data
US 2015/0103405 A1    Apr. 16, 2015

Related U.S. Application Data

(63) Continuation-in-part of application No. 13/638,589, filed as application No. PCT/EP2011/054903 on Mar. 30, 2011.
(Continued)

(30) Foreign Application Priority Data

Mar. 30, 2010    (IT) .............................. MI2010A0532

(51) Int. Cl.
*G02B 26/08*    (2006.01)
*G02B 5/18*    (2006.01)
(Continued)

(52) U.S. Cl.
CPC .......... *G02B 26/0808* (2013.01); *C23C 14/48* (2013.01); *G02B 5/1828* (2013.01);
(Continued)

(58) Field of Classification Search
CPC .............. G02B 26/0808; G02B 5/1828; G02B 5/1861; G02B 26/0825; C23C 14/48;
(Continued)

(56) References Cited

U.S. PATENT DOCUMENTS

2005/0064204 A1    3/2005    Lalli et al.
2006/0197953 A1    9/2006    Perez et al.
(Continued)

FOREIGN PATENT DOCUMENTS

EP          1 130 051 A2      9/2001
JP          2005062104        10/2005
WO     WO 2011/121017 A1    10/2011

OTHER PUBLICATIONS

S. Rosset, et. al., "Metal Ion Implantation for the Fabrication of Stretchable Electrodes on Elastomers", Adv. Funct. Mater. 2009, 19, 470-478.*
(Continued)

*Primary Examiner* — Bumsuk Won
*Assistant Examiner* — Wen Huang
(74) *Attorney, Agent, or Firm* — LeClairRyan PLLC

(57) ABSTRACT

It is described a method for the production of a fully or partially reflective stretchable and deformable optical element, comprising the implantation in at least one surface of an elastomeric support, by a technique of "Cluster Beam Implantation", of neutral nanoclusters of a material selected
(Continued)

among one or more metals, their alloys, their oxides or mixtures thereof, thus obtaining in said support a nanocomposite layer, possibly emerging at the surface of said element, and said implantation taking place by:

uniformly implanting said nanoclusters in a surface of said elastomeric support, wherein said surface has a molded profile essentially corresponding to the profile of the optical element to be produced; or selectively implanting said nanoclusters in a flat surface of said elastomeric support; or uniformly implanting a first layer of said nanoclusters in a surface of said elastomeric support, and then selectively implanting a second layer of said nanoclusters onto the first nanoclusters layer thus obtained.

17 Claims, 15 Drawing Sheets

Related U.S. Application Data

(60) Provisional application No. 61/566,816, filed on Dec. 5, 2011.

(51) Int. Cl.
*C23C 14/48* (2006.01)
*H01B 1/22* (2006.01)

(52) U.S. Cl.
CPC ....... *G02B 5/1861* (2013.01); *G02B 26/0825* (2013.01); *H01B 1/22* (2013.01); *Y10T 428/265* (2015.01); *Y10T 428/31678* (2015.04)

(58) Field of Classification Search
CPC ....... C23C 14/20; C23C 14/221; C23C 30/00; C23C 14/22; H01B 1/22; Y10T 428/265; Y10T 428/31678; Y10T 428/31663; Y10T 428/24372; Y10T 428/24612; Y10T 428/24917; Y10T 428/24802; Y10T 428/2438; B82Y 15/00
USPC .......................................................... 359/572
See application file for complete search history.

(56) References Cited

U.S. PATENT DOCUMENTS

2006/0258132 A1 11/2006 Brown et al.
2013/0017367 A1* 1/2013 Ravagnan ............... C23C 14/22
428/144

OTHER PUBLICATIONS

Ravagnan L. et al., 2009, "Fast Track Communication; Poly(methyl methacrylate)a palladium clusters nanocomposite formation by supersonic cluster beam deposition: a method for microstructured metallization of polymer surfaces," *Journal of Physics D. Applied Physics*, IOP Publishing, Bristol, GB, 42(8):82002.
Wegner K et al., 2006, "Topical Review; Cluster beam deposition: a tool for nanoscale science and technology," *Journal of Physics D. Applied Physics*, IOP Publishing, Bristol, GB, 39(22):R439-R459.
International Search Report and Written Opinion in connection with PCT/EP2012/074492.
The International Preliminary Report on Patentability in connection with PCT/EP2012/074492 dated Mar. 3, 2014.
Koleva, M., Poly(methyl methacrylate) (PMMA), CAE DS—Injection Moulding Materials, Technical University of Gabrovo, Annex 1, pp. 1-5.
Tangram Technology Ltd.—Polymer Data File—PMMA, (2000) Annex 2, pp. 1-5.
Chiu, S. L., et al., Fracture of Metalpolymer Line Structures. I. Semiflexible Polyimide, AIP Journal of Applied Physics, 76, 5136 (1994); doi 10.1063/1.357227.
Johnston, I. D., et al., Mechanical Characterization of Bulk Sylgard 184 for Microfluidics and Microengineering, Journal of Micromechanics and Microengineering, 24 (2014) 035017, pp. 1-8.

* cited by examiner

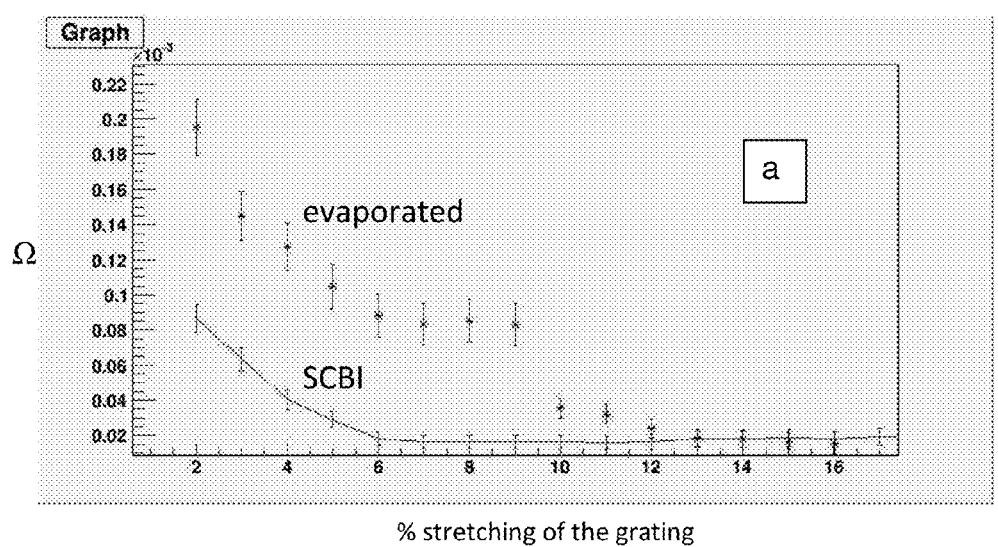
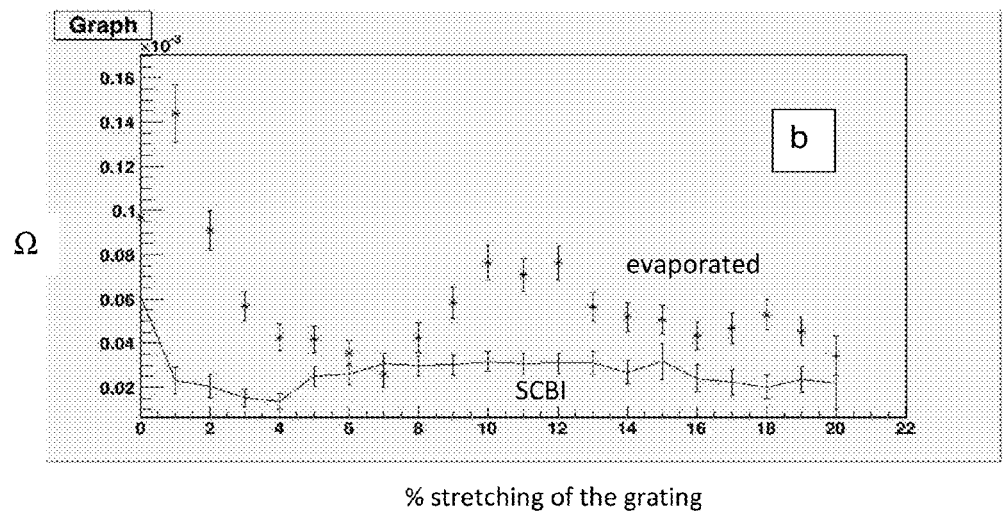
Fig. 10

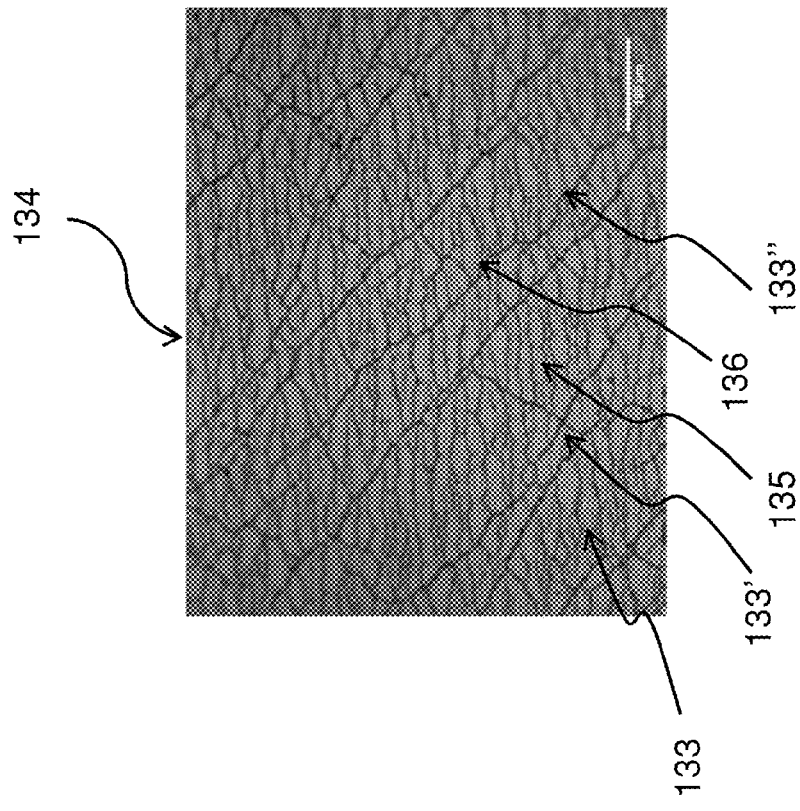
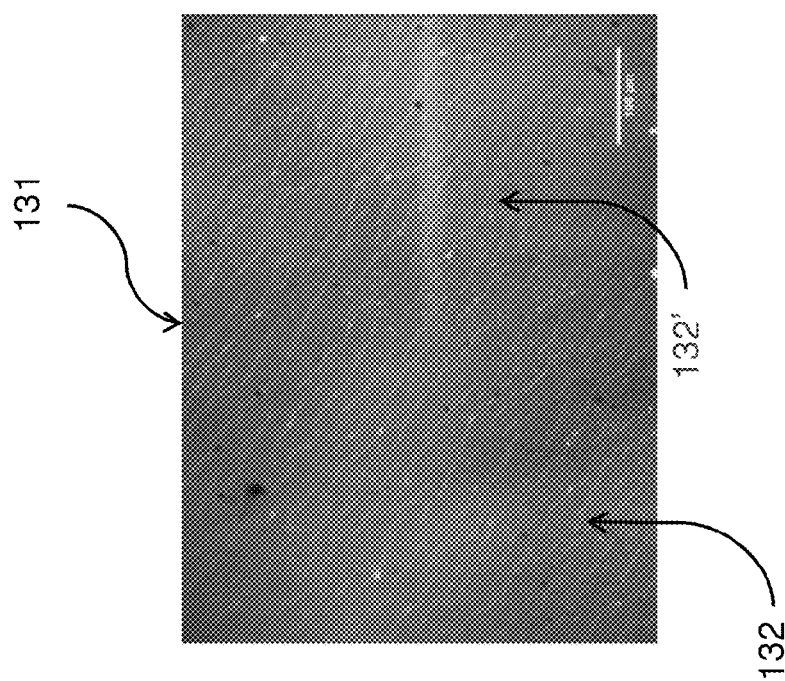
Fig. 13

METHOD FOR THE PRODUCTION OF STRETCHABLE AND DEFORMABLE OPTICAL ELEMENTS, AND ELEMENTS THUS OBTAINED

CROSS-REFERENCE TO RELATED APPLICATIONS

This application is a national stage entry of international application No. PCT/EP2012/074492, filed on Dec. 5, 2012 and entitled "METHOD OF ENHANCING SOFT TISSUE INTEGRATION AND SEAL AROUND PROSTHETIC DEVICES," which claims the benefit of U.S. provisional application No. 61/566,816, filed on Dec. 5, 2011, the teaching of each of which is incorporated herein in its entirety by reference.

This application further claims priority as a Continuation-in-Part of U.S. application Ser. No. 13/638,589, filed on Sep. 28, 2012 and entitled "METHOD FOR THE PRODUCTION OF FUNCTIONALIZED ELASTOMERIC MANUFACTURED ARTICLES AND MANUFACTURED ARTICLES THUS OBTAINED," which is a US National Stage entry of International Patent Application No. PCT/EP2011/054903, filed Mar. 30, 2011, which in turn claims priority to Italian Patent Application No. MI2010A000532, filed on Mar. 30, 2010, each of which is hereby incorporated by reference in its entirety.

FIELD OF THE INVENTION

The present invention relates generally to a method for the production of stretchable and deformable optical devices, in particular stretchable and deformable fully or partially reflective optical devices and more particularly to stretchable and deformable reflective diffraction gratings; the invention also relates to the stretchable and deformable optical devices thus obtained.

PRIOR ART

Stretchable and deformable optical elements are characterized by the ability of changing their optical properties upon modification of their shape due to tensile or compressive strain; these elements are further characterized by being highly conformable and thus applicable to surfaces or deformed to complex shapes and curvatures. Examples of such optical elements are stretchable and deformable diffraction gratings, mirrors, filters, tunable mirrors, near-field imaging devices, light scanners, broadband beam splitters, high reflectivity Distributed Bragg Reflectors (DBRs), optical microcavities or their combinations.

Stretchable and deformable mirrors can be exploited, for example, in all those fields in which a change in the focal length or a modification of the arbitrary incident wave front into well-defined complex shapes, without the use of additional mirrors or lenses, for the correction of optical aberrations is necessary. An example is the application to adaptive optics (Jen-Liang Wang et al., ETRI Journal, 29, 817, 2007). Elastomeric interferometric filters are able to change the thickness of the elastomer in order to tune the wavelength encountering destructive interference (B. Grzybowski, et al. Sensors and Actuators A, 86, 81, 2000).

A particularly interesting kind of stretchable and deformable optical element is represented by diffraction gratings; due to the importance of this application, the description that follows will mainly refers to these elements, but it is intended that the teachings of the invention can be applied to any kind of optical elements among those mentioned above.

A diffraction grating is an optical component consisting of a surface ruled with a periodic structure made of close, equidistant, and parallel features for the purpose of resolving light into spectra. The periodic structure is typically made of slits, grooves, edges or reflective lines on a substrate which splits and diffracts light into several beams traveling in different directions. The direction of these beams depends on the spacing of the grating (defined as the distance between two subsequent features) and the wavelength of the light so that the grating acts as a dispersive element. Because of this, diffraction gratings are commonly used in monochromators and spectrometers.

A diffraction grating is said to be of the transmission or reflection kind according to whether it is transparent or mirrored—that is, whether it is fabricated on a transparent substrate or on a thin metal film deposited on a substrate. In transmission gratings the periodic structure is fabricated on a transparent substrate (such as for example glass BK-7, quartz), the incident light passes through the device and it is diffracted in the side of the grating opposite to that of incidence. Reflection gratings are fabricated in the same way as transmission gratings and on substrates of the same nature: in this case, however, a reflective coating is deposited on one of the two sides of the grating. The incident light beam is reflected and dispersed to the same side of the incident beam. In turn, reflective gratings can be of total or partial reflection kind, depending on whether 100% (or nearly so) of the incident light is reflected, or a part of the incident light is diffracted in the side of the grating opposite to the side of incident light.

Reflection gratings are further classified as plane or concave, the latter being a curved surface ruled with lines that are the projection of equidistant and parallel lines on an imaginary plane surface. The advantage of a concave grating over a plane grating is its ability to produce sharp spectral lines without the aid of lenses or additional mirrors.

Particularly interesting for the aims of the invention are reflective diffraction gratings, both plane or curved, that will be discussed in detail in the following description.

In reflective diffraction gratings the surface with the periodic structure is coated with a thin metal layer chosen among metals, such as aluminum, silver, gold or platinum. One of the most widely used coating techniques is metal evaporation. The process of depositing a metal layer over the surface of an optical element, such as a reflective diffraction grating, is also said "metallization" of the optical element.

In recent years, tunable diffraction gratings have gained an increasing interest because of their property of tuning their optical characteristics. A diffraction grating can be tuned by varying the spacing of the rows of the periodic diffraction structure, the change of the spacing of the rows determines the changing of the wavelength of light which is diffracted at a fixed angle. The different optical components of the incident light can be diffracted over different angles by modifying the pitch of the stretchable and deformable grating through mechanical deformation. With rigid gratings, in which the pitch is fixed, it is necessary the use of different gratings with different pitches, for the study of the different orders of the diffracted radiation. In stretchable and deformable gratings the pitch can be changed continuously by applying a mechanical deformation.

The change of the diffractive periodic structure spacing can be obtained by using a deformable material like, for example, an elastomer, for producing the support of the device. The change in the shape of the deformable material on which the grating is fabricated determines the modification of the pitch of the diffractive periodic structure. This can be exploited to modify the dispersion properties of the gratings (see, e.g., B. A. Grzybowski et al., "Beam redirection and frequency filtering with transparent elastomeric diffractive elements", Applied Optics (1999), Vol. 38, No. 14, page 2997; Bartosz A. Grzybowski et al., "Thermally actuated interferometric sensors based on the thermal expansion of transparent elastomeric media", Review of Scientific Instruments, Vol. 70, Pag. 2031, Year 1999; Steven Chin Truxal, et al., "Design of a MEMS Tunable Grating for Single Detector Spectroscopy", International Journal of Optomechatronics, Vol. 2, Pag. 75, Year 2008; M. Aschwanden et al., "Polymeric, electrically tunable diffraction grating based on artificial muscles", Optics Letters, Vol. 31, Pag. 2610, Year 2006). In particular, by stretching the grating in the direction orthogonal to the grooves direction, the pitch distance (the distance between two peaks of the periodic structure that composes the grating) increases and consequently the diffraction angle of the exiting light beam becomes lower with respect to the normal direction of the grating plane, for a given diffraction order. By stretching the elastomeric grating in the same direction as the diffractive grooves it is possible to diffract the incident light to a larger angle, by exploiting the decrease of the pitch distance between the lines due to the Poisson ratio of the grating substrate.

The use of tunable elastomeric gratings is indicated in the literature as desirable for many applications requiring miniaturized spectrophotometers, for the tuning of the output wavelength in solid-state lasers and their coupling with fiber optics systems (see, e.g., S. C. Truxal et al. International Journal of Optomechatronics) or for the fabrication of light scanners (see, e.g., A. N. Simonov et al., Optics Letters 30, 949, 2005).

An important parameter for a useful and reliable grating is the efficiency of light diffraction, defined as the ratio of the power of monochromatic light diffracted into the order being measured relative to the power of incident light. If the incident light intensity is low, it is useful to concentrate all the diffracted light in one given order of diffraction. Gratings with particular geometry of the profile in the periodic structures are available for this purpose; however the efficiency of such particular gratings is optimized for a limited wavelength range. A high efficiency on a wide range of the visible spectrum can be achieved by varying the geometry of the periodic structure of the grating, for example by modifying the ratio between the height of the grooves and the pitch distance. This can be obtained by the use of reflective stretchable and deformable gratings undergoing mechanical deformations; transmissive gratings of this kind are available, but the quality of these elements is not satisfying, because they are known to introduce aberrations in the operation of optical system in which they are present.

Due to the high conformability and elasticity of the substrate on which these reflective diffraction gratings are fabricated, they can also be deformed or applied to complex non-planar surfaces (for example cylindrical or spherical, M. Kolle, et al., Optics Express 18, 4356, 2010) in order to diffract the incident light and modify the arbitrary wave front of the incident light beam to a well-defined wave front of the diffracted light beam, avoiding the use of additional mirrors or lenses. This is useful, for example, in order to modify the wave front (for example for the correction of optical aberrations) and/or to focus a diffracted light beam with just a single optical element.

Stretchable and deformable reflective diffraction gratings can be produced using different techniques.

In order to produce reflective diffraction gratings it is necessary to coat or embed in the optical active surface of the molded elastomeric grating a mirror-like reflecting layer, as for instance metallizing the said surface with a reflective metal (as for example Ag, Al, Au . . . ). Among the many possible metallization techniques, one of the most used is metal evaporation. In a particular example of metal evaporation, a metal is put in a crucible (with a melting temperature much higher than the one of the metal to be evaporated) heated by Joule effect by a high current passing through it. When the melting temperature of the metal is reached, its atoms begin to evaporate in a high vacuum chamber and travel in straight line towards, and eventually stick onto, the substrate, which is held in front of the crucible. This technique allows obtaining a metal layer on the surface of the substrate. Metal evaporation is widely used as coating technology for optical applications but is not compatible, as known by those skilled in the art, with a deformable substrate (and in particular with stretchable substrates) because of the rigidity of the produced metal layer. Furthermore, as known by those skilled in the art, evaporated metal layers have low adhesion to elastomeric substrate, causing the delamination and/or fracture of the metal layer during the deformation of the elastomeric substrate, and during the evaporation process the substrate is considerably heated, leading eventually to deformations of the polymeric substrate used in the process. Another problem with this approach is that the surface tension of the metal thin layer on the surface causes the formation of buckles and wrinkles in the elastomeric substrate compromising the optical quality of the device (see, e.g., J. Genzer, J. Groenewold, Soft Matter, Vol. 2, Pag. 310, Year 2006).

As known by those skilled in the art, these are just some of the many drawbacks involved in a metal evaporation process.

A different approach consists in producing an elastomeric grating structure by replicating a rigid grating, covering it with a liquid metal (mercury of gallium) and covering the device with a layer of an elastomeric material to emboss the liquid metal. The device is stretchable, conformable and no deterioration of the optical quality is observed, however the weight of embedded liquid metal causes the deformation of the grooves structure, thus negatively affecting the performances of such devices (see, e.g., Wilbur et al., Chem. Mater., 1996, 8, 1380-1385).

Similar drawbacks are encountered in the fabrication of other stretchable and deformable optical devices, such as DBRs, mirrors or interferometric filters.

It is thus an object of the invention to provide a method that allows to overcome the mentioned drawbacks of the prior art.

Another object of the invention is to provide the stretchable and deformable optical elements, in particular diffraction gratings, produced by said method.

SUMMARY OF THE INVENTION

These objects are obtained according to the present invention with a method for the production of a fully or partially reflective stretchable and deformable optical element, comprising the implantation in at least one surface of an elastomeric support, by a technique of cluster beam implantation, of neutral nanoclusters of a material selected among one or more metals, their alloys, their oxides or mixtures thereof, thus obtaining in said support a nanocomposite layer, possibly emerging at the surface of said element, and said implantation taking place by:

uniformly implanting said nanoclusters in a surface of said elastomeric support, wherein said surface has a molded profile essentially corresponding to the profile of the optical element to be produced; or selectively implanting said nanoclusters in a flat surface of said elastomeric support; or uniformly implanting a first layer of said nanoclusters in a surface of said elastomeric support, and then selectively implanting a second layer of said nanoclusters onto the first nanoclusters layer thus obtained.

As used in the description and claims, by the term "nanocomposite layer" it is meant a composite layer made of nanoclusters of metals, alloys or oxides embedded in the elastomeric support.

BRIEF DESCRIPTION OF THE FIGURES

The invention will be illustrated in detail below, with reference to the Figures, in which:

FIG. 10 shows two graphs representing a measure of the quality of a grating of the invention, respectively at the first elongation cycle (inset a) and at the 1000th elongation cycle (inset b);

FIG. 13 show photographs taken with an optical microscope of the surface of a grating of the invention and a grating of the prior art after stretching;

DETAILED DESCRIPTION OF THE INVENTION

Figure 1:
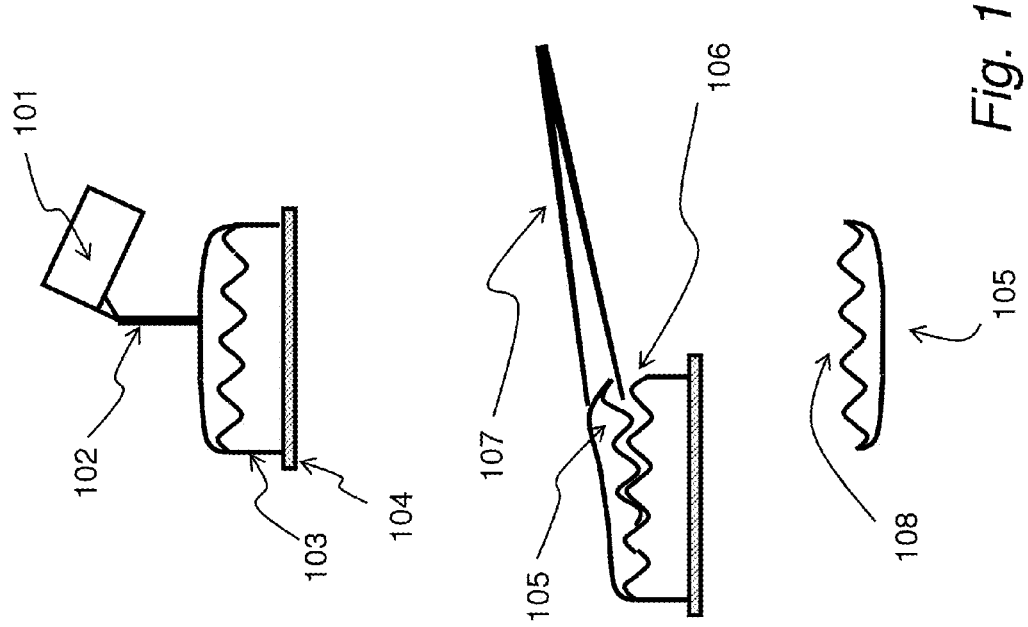
FIG. 1 shows the steps of preparation of the elastomeric support of a grating according to a first embodiment of the invention.

With the method of the invention, it is possible to produce a great variety of stretchable and deformable fully or partially reflective optical elements, such as gratings, mirrors, interferometric filters, beam modulators, near-field imaging devices or combinations of said devices. Due to the importance in particular of stretchable and deformable reflective diffraction gratings, the description that follows is made with reference to these elements, but the teachings herein can be applied to the production of any kind of stretchable and deformable fully or partially reflective optical elements.

In particular, the method makes possible to produce a stretchable and deformable reflective grating that can withstand stretching up to at least 25%, and that change consequently the pitch distance of the same amount preserving the capability of diffracting the incident light. The stretchable and deformable reflective grating can have or can be applied to arbitrary complex shapes, and is made in at least one of its portions by an elastomeric polymer.

Preferably, the stretchable and deformable reflective grating is made by an elastomeric polymer support with a thickness that can range from few micrometers to some millimeters.

Illustrative examples of elastomeric polymers that can be used in the present invention include, but are not limited to: polysiloxanes (i.e. silicone polymers), silicone rubbers, latex, thermoplastic elastomers, photoresists, polyurethane, polyamide, polyimide, fluoropolymers, polyvinyl pyrrolidone, polyethylene glycol, polyethylene oxide, polyvinyl alcohol and hydrogels; the preferred elastomeric polymer is polydimethylsiloxane (PDMS).

The condition that the nanocomposite layer emerges at the surface the optical element may be necessary or not depending on the nature of the chosen elastic polymer. With transparent polymers, for instance PDMS, said condition is not necessary: in these polymers, even if the nanocomposite layer is completely buried below the surface of the elastomeric support, the optical element fulfils anyway the desired function as fully or partially reflective element, given the fact that the nanocomposite layer is very close to said surface (generally not deeper than 1 µm below said surface). On the other hand, when the elastomeric polymer is not transparent, the nanocomposite layer must necessarily emerge on the surface of the element in order to achieve the desired reflectivity.

Stretchable and deformable reflective gratings can be produced according to two main embodiments of the present invention. In the first embodiment, it is first provided an elastomeric support having a surface geometry essentially equal to that of the grating to be produced; a support of this kind will be referred to in the following as "molded support"; the grating-shaped surface of this molded support is then uniformly implanted with nanoclusters in the superficial layer, up to a penetration depth varying between 10 nm and 1 µm. In the second embodiment, the surface of the elastomeric support where nanoclusters are implanted has not a profile resembling that of the final grating, and the grating is obtained by localized implantation, by the use of masks, of nanoclusters only in selected areas of said surface.

According to the first embodiment of the invention, on at least one side of the elastomeric support the periodic structure of a grating is produced, for example, by using the standard molding/embossing technique, as known by those skilled in the art, using a preformed mold (also called "master").

This first step of the method of the invention is described below with reference to FIG. 1.

A liquid precursor of the chosen elastomeric polymer (in short referred to as "liquid polymer") is provided. The liquid polymer, contained in a beaker, 101, is preferably placed, before use, in an evacuated chamber, in order to expel any air from the liquid that could lead to the formation of bubbles, and thus defects, in the final product. As shown in the upper part of the figure, the liquid polymer thus obtained, 102, is then poured on the grooved surface of a rigid grating, 103, that is kept horizontal on a leveled plane, 104, in order to avoid inhomogeneities in the thickness of the molded elastomeric grating, 105. The rigid grating may be, for example, a classic planar rigid diffraction grating; rigid gratings that can be used in the invention may have grooves density in the range between 10 and 20000 lines/mm. The thickness of the molded elastomeric grating depends on the amount of liquid polymer deposited on the rigid grating 103, that can be varied arbitrarily, but must be at least such to cover the whole surface of rigid grating and that the obtained molded elastomeric grating, 105, forms a continuous body. The liquid polymer is then polymerized, that is, cross-linked or cured, by any method known by those skilled in the art (depending on the chosen polymer); if the liquid polymer requires, for its cross-linking, the addition of a curing agent, such as a radicalic compound, this can be added in the proper ratio to the liquid polymer before the evacuation step; other known methods for initiating the cross-linking of a liquid polymer are by heating or UV curing. After the polymerization, a molded elastomeric grating, 105, having a rubber-like aspect is obtained, that can be removed from the rigid grating 103; the removal procedure can be performed, for example, by very slowly detaching the molded grating 105 from the rigid grating 103, starting from the corners and the external edges, 106, of the latter with the aid of tweezers, 107; this step is shown schematically in the central part of the figure. As shown in the bottom part of the figure, the surface, 108, of the molded elastomeric grating originally in contact with the rigid grating, exactly reproduces the periodic structure of the latter.

In the second step according to this first embodiment of the invention, in order to produce an optical element according to the invention, a reflective layer is produced on the elastomeric support obtained in the first step. Different from the coating methods of the prior art, said reflective layer is obtained by direct implant of electrically neutral "nanoclusters" in the polymer.

The term nanocluster denotes small, multi-atom particles composed by a number of atoms ranging from few units to several thousands, and having sizes ranging from few angstroms to hundreds of nanometers. Nanoclusters have properties, like for example electrical conductivity, light absorbance and magnetic properties, depending on their size and shape, and that are radically different by the properties of a macroscopic solid made by the same materials.

By "electrically neutral" is meant that the nanoclusters, on average, do not have an excess or lack of electrons and therefore have charge state equal to zero. Electrically neutral nanoclusters do not interact with, or by means of, electrostatic or electrodynamic forces.

Nanoclusters can be produced with different techniques, using common sources of particles with nanometric size. As known by those experts in the art, there are a huge number of different types of nanoclusters sources. These types often differ from each other only by technical construction details or by the process involved in the vaporization of the materials used for the fabrication of the said nanoclusters (for example, some techniques are the sputtering process, laser evaporation, electron beam evaporation and so on).

There are two main classes of nanocluster sources: the ones where nanoclusters come out from the source after their synthesis, spreading out freely and with random direction, and the ones where nanoclusters are dragged out from the source through an inert gas carrier, in order to form a "beam" in which nanoclusters and the gas are mixed together.

By the term "beam of nanoclusters" it is meant a spatially localized group of nanoclusters that have roughly the same velocity (speed and direction). A beam of nanoclusters is typically produced by a cluster source where the particles are formed by physical or chemical processes starting from a gaseous, liquid or solid precursor, and mixed with a gas (named "carrier gas"), preferably inert, that is used to favor the extraction of the nanoclusters from the source. A beam of nanoclusters is generally characterized by the material constituting the nanoclusters, their mean diameter (also said "nanoclusters size") or distribution of diameters, their mean velocity (or distribution of velocities), and the divergence of the beam. By "divergence of the beam of nanoclusters" is meant the angular measure of the increase in beam diameter with distance from the aperture of the cluster source from which the beam emerges.

For the aims of the present invention, cluster sources from which a beam of nanoclusters can be extracted, said "cluster beam sources", are used. In particular, when the expansion of the carrier gas with said nanoclusters happens in supersonic conditions, then the "beam of nanoclusters" is named "supersonic cluster beam". Similarly, the technique using beam of nanoclusters extracted from cluster beam sources in order to implant nanoclusters into a polymeric substrate is called cluster beam implantation, abbreviated in "CBI", and the technique using a "supersonic cluster beam" is named supersonic cluster beam implantation, or "SCBI" (see, e.g., G. Corbelli et al., "Highly Deformable Nanostructured Elastomeric Electrodes With Improving Conductivity Upon Cyclical Stretching", *Advanced Materials*, Vol. 23, page 4504, Year 2011).

The technique for producing the beam of nanoclusters according to the invention is SCBI. A supersonic cluster beam apparatus is represented schematically in FIG. 2; this apparatus, and its operation, are described in detail in patent application WO 2011/121017 A1, in particular in the sections between pages 12 and 17 of said publication, which are incorporated herein in their entirety. For the aims of the present disclosure, a brief description of a SCBI apparatus is given here below with reference to FIG. 2. The SCBI apparatus, 200, comprises three main zones, a cavity 201 acting as cluster beam source, an expansion chamber 204 and a deposition chamber 209. In cavity 201 is housed the material precursor of the nanoclusters, that is exemplified in the drawing by a rod 202, but could be in the form of powders contained in a crucible placed in the cavity; a valve 203 controls the entrance of a process gas, typically a high purity noble gas (or a mixture of high purity noble gases) in cavity 201. The cavity communicates with expansion chamber 204 through a hole, and typically through a collimator 205, composed of a series of stages interconnected with each other by aerodynamic lenses constituted by disks with a central hole (typically of a few millimeters in diameter); the last stage of the collimator is in its turn connected to the expansion chamber via another aerodynamic lens. Expansion chamber 204 is kept evacuated, by a pumping system generally indicated in the drawing as element 206, to a pressure typically comprised between $1.0 \times 10^{-6}$ Pa and $1.0 \times 10^{-3}$ Pa. Expansion chamber 204 in its turn communicates with deposition chamber 209 through an opening, typically in the form of a cone with an opening at the tip, known in the field as "skimmer", indicated in the drawing as element 208. Deposition chamber is evacuated, by means of a second pumping system 210, to a pressure higher than that present in chamber 204, and typically between $1.0 \times 10^{-3}$ Pa and $1.0 \times 10^{-2}$ Pa. In deposition chamber 209 is housed a sample holder, 211, onto which the support to 212 to be covered with nanoclusters is fixed.

The operation of this source is described here with reference to the case in which the precursor of nanoclusters is a metal rod, and the material that will form the nanocluster is removed from it by application of an electric field; however, it will be evident to those skilled in the art that the same results could be obtained also with different systems, for instance by evaporating by any known means (thermally, laser ablation, . . . ) in cavity 201 a material contained in a crucible.

The operation of the cavity 201 is typically cyclic, with a frequency of a few Hertz. During each cycle, valve 203 is opened for a time generally comprised between 150 and 350 µs, allowing the selected gas (e.g., He, Ne, Ar or their mixtures) and after a delay comprised between 0.35 and 0.85 ms a voltage ranging between about 500 and 1000 V is applied between the metal rod 202 (acting as cathode) and an anode present in the cavity; the application of voltage is maintained for a period between about 40 and 120 µs in each cycle. Under these conditions, a mixture of the selected gas and nanoclusters of the metal of the rod is generated, having generally a pressure of between about 0.1 and 0.5 bar. Owing to the pressure difference between cavity 201 and expansion chamber 204, the mixture is accelerated towards the latter, where it expands forming a divergent "beam" 207 generally having a velocity between about $10^2$ and $10^4$ m/s. The central part of this beam passes through the opening in skimmer 208 and reaches the elastomeric support 212 fixed on the sample holder 211, which is aligned on the axis defined by collimator 205 and skimmer 208; due to their velocity, the nanoclusters of the beam are implanted in the surface of elastomeric support 212.

Commonly, the sample holder is connected to a remote-controlled motorized system, which is able to move it (and consequently the elastomeric support) in the two directions orthogonal to the axis of the cluster beam, enabling the "rastering" and thus the covering of the support with nanoclusters over a relatively wide area, for instance in the order of $10 \times 10$ cm$^2$ (as known by those skilled in the art, for instance by the paper of Corbelli et al. mentioned above).

During the nanocluster deposition, it is possible to fix onto the sample holder, next to the elastomeric support, a small piece of silicon half-covered with a sheet of aluminum. This is exposed to the same nanoclusters beam directed onto the elastomeric support, for the same exposure time; upon completion of the deposition run, a measure, called "equivalent thickness" of the amount of deposited nanoclusters on the rigid, non-implantable substrate, gives a measure of the amount of nanoclusters implanted in the elastomeric support (for details of the method, see for example the article of Corbelli et al. mentioned before).

Illustrative examples of materials that can be used in the present invention for the nanoclusters of the beam include, but are not limited to: metals, like for example Au, Ag, Pd, Pt, Cu, Ti, Fe, Ni, Cr, Co, Nb, Zr, Al, V, Zn, Mo, W, Pb, Sn, Hf, Ir, their alloys and oxides. The beam of nanoclusters can contain particles all made by the same material or made by different materials. The term "metallic" is used in the present invention to denote a material that includes at least one metal or metal alloy that is conductive.

The preferred materials for use in the present invention are Au, Pt, Al and Ag. Au is a noble metal, has a high reflectivity and is preferred for all those application in which IR radiation is involved. Ag and Al are highly reflective materials and are commonly used as coating metals for commercially available reflective diffraction gratings.

Preferably, the nanoclusters of the beam have mean diameter below 50 nm and more preferably between 1 nm and 20 nm.

The mean velocity (or distribution of velocities) of the nanoclusters may vary in a wide range; typical values of implantation velocity of the nanoclusters are comprised between about 100 m/s to about 10000 m/s, commonly from 500 m/s to 2000 m/s.

Typically the divergence of a beam produced by a nanoclusters source is comprised between 0° and about 90°. For the objects of the present invention, the beam has preferably divergence between 0° and about 10°, and more preferably below about 2°.

Figure 2:
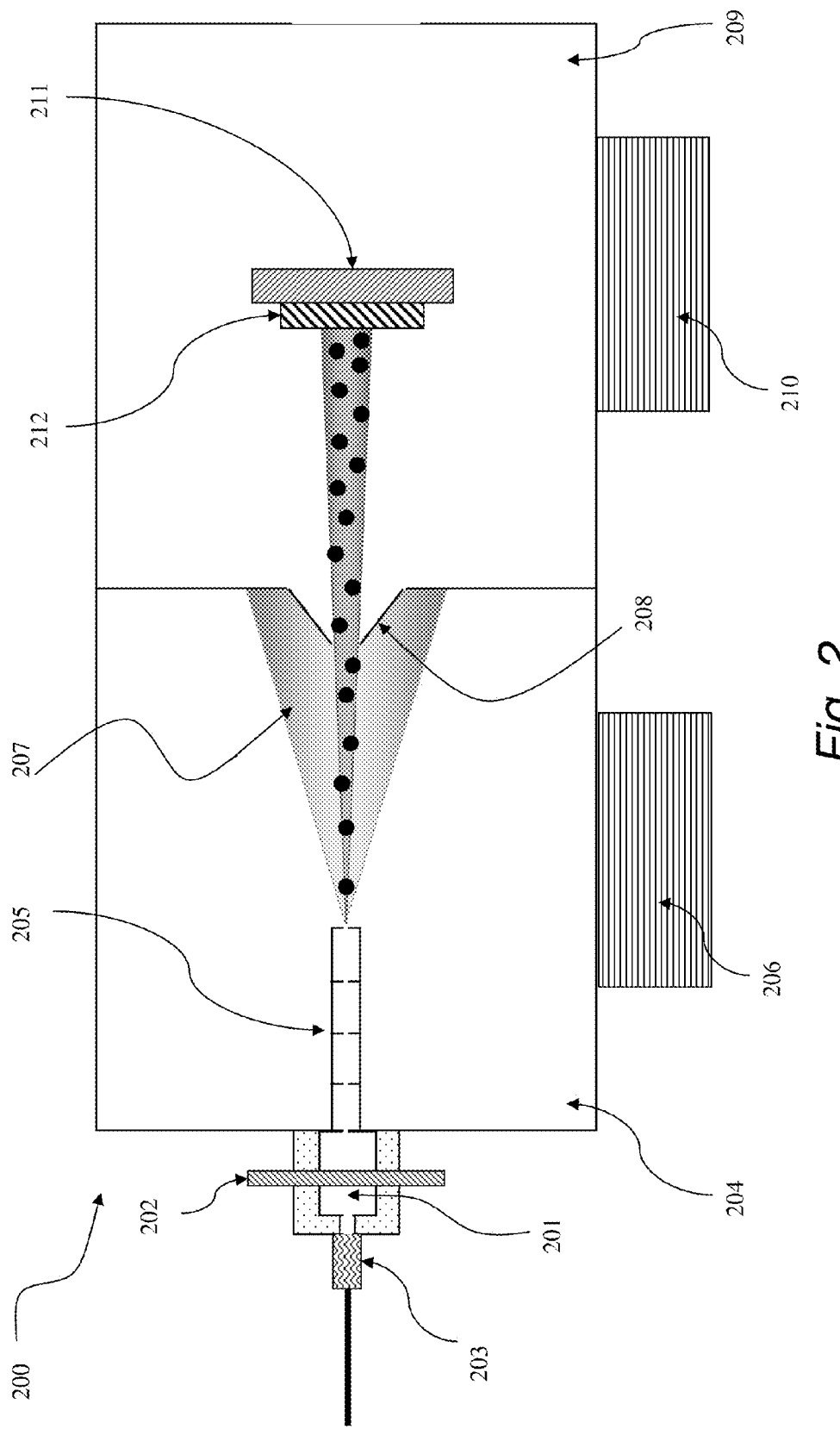
FIG. 2 shows a possible system for production and implantation of nanoclusters for carrying out the method of the invention.

By using a beam of nanoclusters produced by one of the techniques referred to above, and in particular by a supersonic cluster beam apparatus as the one depicted in FIG. 2, it is possible to implant nanoclusters of the desired material in a superficial layer of the molded elastomeric grating, 105, produced as previously described. In this way, a nanocomposite layer is created in this superficial layer of the elastomeric support.

Figure 3:
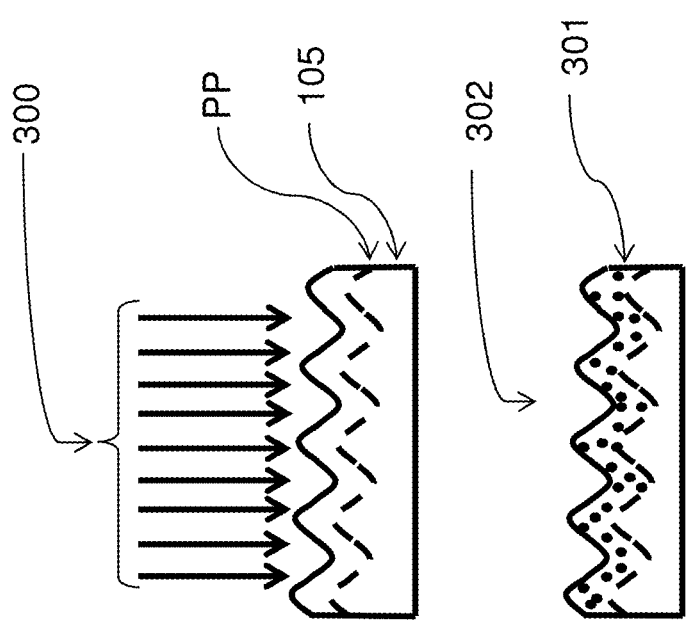
FIG. 3 shows, schematically and in section, a stretchable and deformable grating of the invention at different stages of production.

The steps for the production of the nanocomposite layer are depicted in FIG. 3. FIG. 3 shows the molded elastomeric grating 105 and the beam of nanoclusters, 300, that are implanted in it, to form the nanocomposite layer, 301.

The term "nanoclusters implantation" is used in the description that follows to denote a process in which neutral nanoclusters having velocity in the direction of the molded elastomeric grating, 105, collide with its surface facing the nanoclusters source and due to their physical properties (such as their kinetic energy and inertia) penetrate therein. During the penetration process the nanoclusters are decelerated, and they stop at a distance from the exposed surface (below the surface) of the molded elastomeric grating that is said "penetration depth". The maximum value of the penetration depth obtained during the nanoclusters implantation process is said the "thickness" of the nanocomposite layer (indicated with PP in the Figure). The result of this process is the grating 302.

Typically the thickness of the nanocomposite layer is comprised between 5 nm and 10 µm, preferably between 10 nm and 1 µm. The thickness of the nanocomposite layer can be chosen, depending on the material of the molded elastomeric grating 105 and on the material of the nanoclusters in beam 300, by choosing the temperature of the molded elastomeric grating during the implantation process (said "implantation temperature"), the velocity of the nanoclusters immediately before their impact on the surface of the molded elastomeric grating (said "implantation velocity") and the size or distribution of sizes of the nanoclusters.

The typical implantation temperature for the polymers used in this invention ranges from about −10° C. up to about 150° C., preferably between 20° C. and 90° C. Typical implantation velocity of the nanoclusters are comprised between about 100 m/s to about 10000 m/s, preferably from 500 m/s to 2000 m/s. Preferred conditions for carrying out the invention are an implantation temperature of about 25° C. and an implantation velocity of about 1000 m/s.

Independently by the thickness of the nanocomposite layer 301, the density of nanoclusters implanted in the molded polymeric grating 105 can be chosen by varying the amount of implanted nanoclusters. By "density of nanoclusters" is meant the number of nanoclusters of the beam, 300, colliding on the molded polymeric grating per unit area, divided by the thickness of the resulting nanocomposite layer 301. It is underlined that the defined density of nanoclusters can be higher than the number of nanoclusters present in the nanocomposite layer divided by its volume. Indeed, during and after their implantation, the nanoclusters of the beam can undergo aggregation processes in the polymer matrix, leading to a reduced number of nanoclusters embedded in the polymer having bigger sizes in comparison to the size of the original nanoclusters. The density of nanoclusters of the nanocomposite is typically from about $10^{-7}$ cluster/nm$^3$ to about $10^{-1}$ cluster/nm$^3$. For the objects of the present invention, the density of nanoclusters is preferably from $10^{-5}$ cluster/nm$^3$ to about $10^{-1}$ cluster/nm$^3$.

The nanocomposite layer, 301, may be cured after its production, at a temperature from about 40° C. to about 120° C. for a period from about 0.3 to about 48 hours. Curing the nanocomposite layer accelerates the aggregation processes of the implanted nanoclusters in the polymer and promotes the reorganization (i.e. the further polymerization) of the polymeric matrix in which the nanoclusters are embedded. As a result the cured nanocomposite layer has structure and physical properties that do not evolve with time.

The nanocomposite layer, 301, can be insulating or conductive. By "insulating", as used in the present description, it is meant that the nanocomposite layer does not allow the flow of a measurable electric current when an electric potential is applied between two points of the same. By "conductive" it is meant that the nanocomposite layer allows the flow of a measurable electric current "I" that is proportional to the electric potential "V" applied to the layer. The ratio V/I measured on a conductive layer is the electrical resistance "R" (or resistance) of the nanocomposite layer.

When implanting metallic nanoclusters, an insulating nanocomposite layer is obtained for densities of nanoclusters lower than a critical value (said "critical density of nanoclusters"). The value of the critical density of nanoclusters depends to the size or size distribution of the implanted nanoclusters and to the polymer used for the molded elastomeric grating. When the said critical density of nanoclusters is exceeded, the nanocomposite layer is conductive. Typical values for the critical density of nanoclusters for the materials used in the present invention range from about $3 \times 10^{-4}$ cluster/nm$^3$ to about $1 \times 10^{-3}$ cluster/nm$^3$.

In the second embodiment of the process of the invention, a grating is produced on a surface of the elastomeric support which has not a profile corresponding to that of the final optical element.

In this second embodiment of the invention, the grating is produced directly during the step of nanoclusters implantation, by selectively directing the nanoclusters only onto preset areas of the elastomeric support; this can be done by using of photolithographic or stencil masks masking, a technique well-known to those skilled in the field of depositions, thanks to the extreme collimation of the beam that can be reached by properly adjusting the geometric construction of the apparatus of FIG. 2. This technique allows producing a reflective periodic structure with micrometric or sub-micrometric features, depending on the size of the mask apertures.

Figure 4:
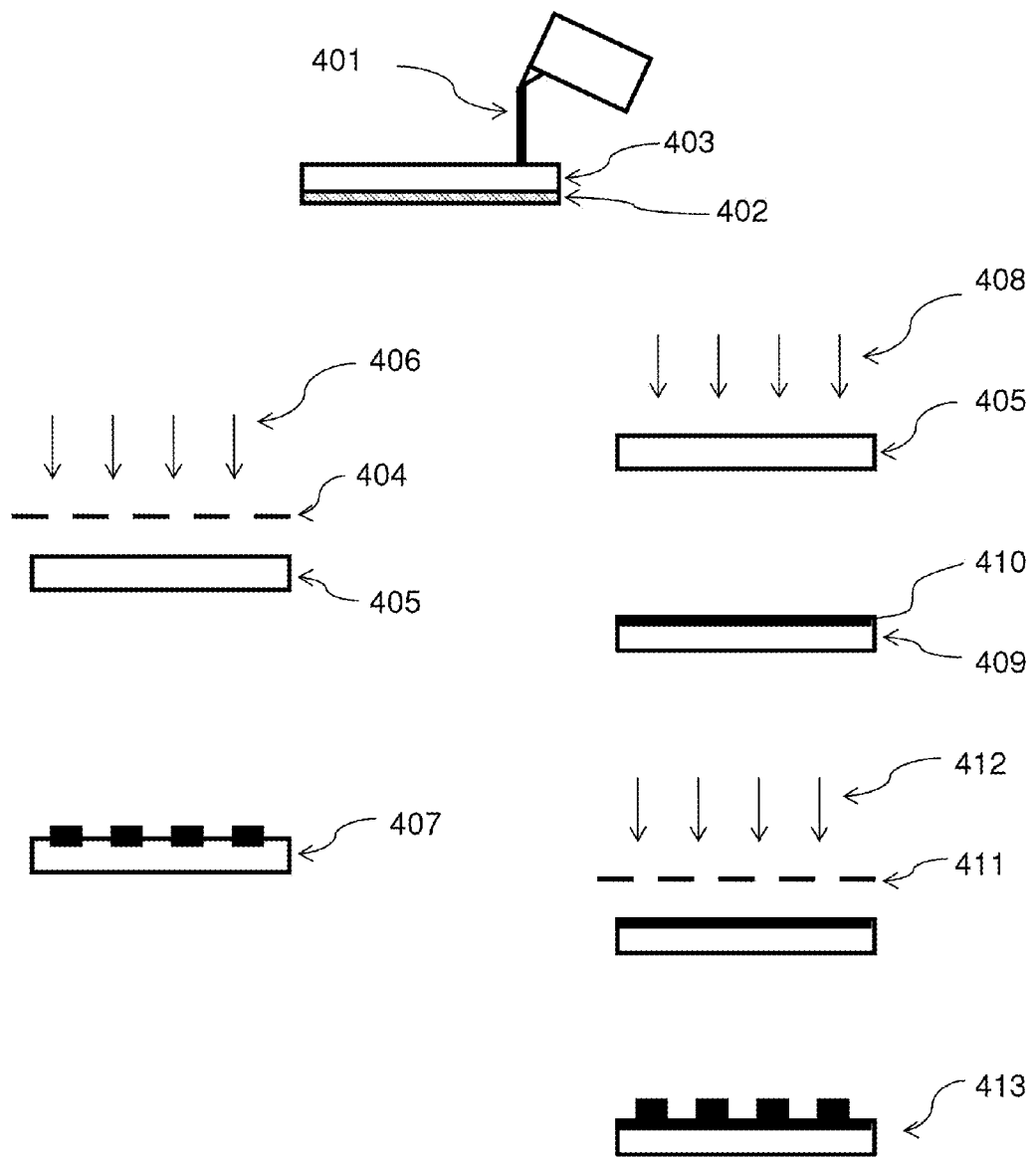
FIG. 4 shows the steps of preparation of the elastomeric support of a grating according to a second embodiment of the invention.

The second embodiment of the invention is described below with reference to FIG. 4. In particular, the left-hand side of the drawing schematically represents a first implementation of this second embodiment, while the right-hand side of the drawing schematically represents a second implementation said embodiment of the invention.

In both implementations, the process starts with the production of an elastomeric layer, preferably made of PDMS as mentioned above; this layer may be produced starting from a liquid polymer (preferably, liquid PDMS) following the same procedure described before with reference to FIG. 1. The liquid polymer, 401, is then cast onto a planar substrate 402, for example a glass slide. It is obtained a layer of liquid polymer, 403, typically with a thickness between about a few micrometers up to some millimeters, that after polymerization (cross-linking or curing) produces an elastomeric support 405.

In the first implementation, a stencil mask (404) is applied above the elastomeric support at a distance that can vary from few micrometers up to about 1 millimeter. The stencil mask may be, for instance, a TEM grid. The assembly formed by the elastomeric support and the mask is then mounted onto the sample holder of a SCBI apparatus as the one described with reference to FIG. 2, and subjected to nanoclusters deposition according to the procedure described before; the flow of nanoclusters towards mask and support is schematically represented by arrows 406 The result of the process is grating 407, formed by reflective "islands" produced on the surface of support 405 by the localized deposition of nanoclusters in areas corresponding to the openings of the mask. Grating 407 is of the partial reflection kind, namely, such that part of the incident light is reflected and part is transmitted across the grating.

In the second implementation (right-hand side of FIG. 4), support 405 is first subjected to deposition of an uniform metallization layer, produced by a non-masked flow of nanoclusters represented by arrows 408; the result is the intermediate product 409, made of support 405 whose upper surface is wholly covered by a continuous reflective layer 410. Product 409 is then subjected to a second nanoclusters deposition run, using this time a mask 411; the nanoclusters flow, indicated by arrows 412, produces protrusions in areas corresponding to the openings of the mask 411. The result is grating 413, that being formed by surfaces at different heights of the same, reflecting material, is of the total reflection kind.

The advantage of this technique respect to starting from a molded elastomeric film is the possibility of creating complex periodic structures (and so obtaining complex diffraction patterns) of the partially- or highly-reflective stretchable and deformable SCBI grating by using proper, commercially available, stencil or lithographic masks.

The quality of reflective stretchable and deformable gratings produced according to either embodiments of the invention can be checked by directing a laser beam onto the grating perpendicular to the average surface of the same, and measuring the angle (known as "diffraction angle") between the direction of the first order of diffraction and the direction normal to the grating (i.e. the incident laser beam direction). As well known in the field, in a properly functioning planar diffraction grating the diffraction angle measured in the configuration indicated above is directly related to the pitch distance of the grating according to the following equation:

$$d = m\lambda/\sin\theta \qquad \text{(eq. 1)}$$

where "d" is the pitch distance, "m" the diffraction order for which the diffraction angle was measured, "λ," the laser wavelength and "θ" the diffraction angle.

By comparing the pitch distance of the grating obtained from the measured diffraction angle (calculated by means of equation 1) with the same quantity measured by the morphological characterizations of the grating it is therefore possible to check if the grating is correctly functioning as a planar diffraction grating, thus checking its proper optical functionality.

The measure of the diffraction angle can be done by using an apparatus described below with reference to FIG. 5. The grating under exam is mounted on a sample holder the position of which can be controlled in the three spatial coordinates; the system in which the sample holder is mounted is described later on. A monochromatic light laser beam 501 is emitted by a laser source 502 and reflected toward the grating 503 by means of an appropriate optical setup (as known in the art) made by a series of mirrors, 504, 504'. The grating 503 is mounted on a custom-made stretcher, 505, capable to apply a controlled strain to the grating in the direction orthogonal to the grating's grooves. The stretcher comprises a computer-controlled stepper motor 506 that actuates an optical translator stage 507. The grating is fixed at its two opposed edges (in the direction orthogonal to the grooves), by means of two holders, 508 and 508', at the one side to the optical translator stage 507 and to the other side to a fixed base. The two holders avoid any sliding of the grating away from the optical translator stage and from the fixed base during stretching, thus allowing to precisely control of the percentage of stretching applied to the grating; the percentage of stretching ("% of stretching") is defined as the ratio (expressed in percentage) between the increase of length of the elastic body due to the applied strain, over the original length of the same body in the direction of the applied strain. The whole stretcher 505 is mounted in the optical setup by means of two vertical mounting plates, 509 and 509', which in turn are mounted on two different optical translators 510 and 510', for the precise vertical alignment of the grating with the incident laser beam, 511. The mirrors of the optical setup, 504 and 504', are aligned in order to direct the incident laser beam 511 orthogonally onto the grating. Thank to this optical arrangement, the grating diffracts the incident laser beam in two light beams, 512 and 512', having the same, but opposite, diffraction angle with respect to the incident laser beam direction (i.e. with respect to the normal to the grating surface). The diffraction angle can be calculated (using equation 1) by measuring the distance of the two spots, 513 and 513', produced by the two diffracted beams 512 and 512' when they intercept a white graduated screen, 514, put in front, parallel and at well-defined distance from the grating.

As described above, the apparatus also comprises a stretcher 505, making possible to evaluate the optical properties of the grating upon application of a controlled strain in the direction orthogonal to the grating's grooves. Remarkably, if the elastic properties of the bare molded PDMS grating are maintained after the metallization process (i.e. the "stretchable and deformable SCBI grating" is really stretchable) and the applied strain is such that Poisson deformation is negligible, then the % of stretching applied to the grating should be equal to the percentage of variation of the pitch distance (i.e. the percentage of variation of the distance between subsequent grooves of the grating, obtained as the ratio between the amount of change of distance between subsequent grooves due to the applied strain, over the distance between subsequent grooves when no strain is applied).

If the grating maintains its proper optical functionality also during stretching, then the "% of stretching" should be equal to the "percentage of variation of the pitch distance" determined, using equation 1, by the measurement of the diffraction angle at any applied strain: thus the two quantities should be linearly correlated with angular coefficient equal to 1. In real systems, this angular coefficient (also referred to in the following as "coefficient of optical stretchability") is hardly equal to 1; the closeness of the measured angular coefficient it is thus an indication of quality of the optical system during stretching: stretchable gratings having an angular coefficient of 0.8 are less efficient (from the optical and mechanical point of view) than stretchable gratings having an angular coefficient of 0.99.

Figure 5:
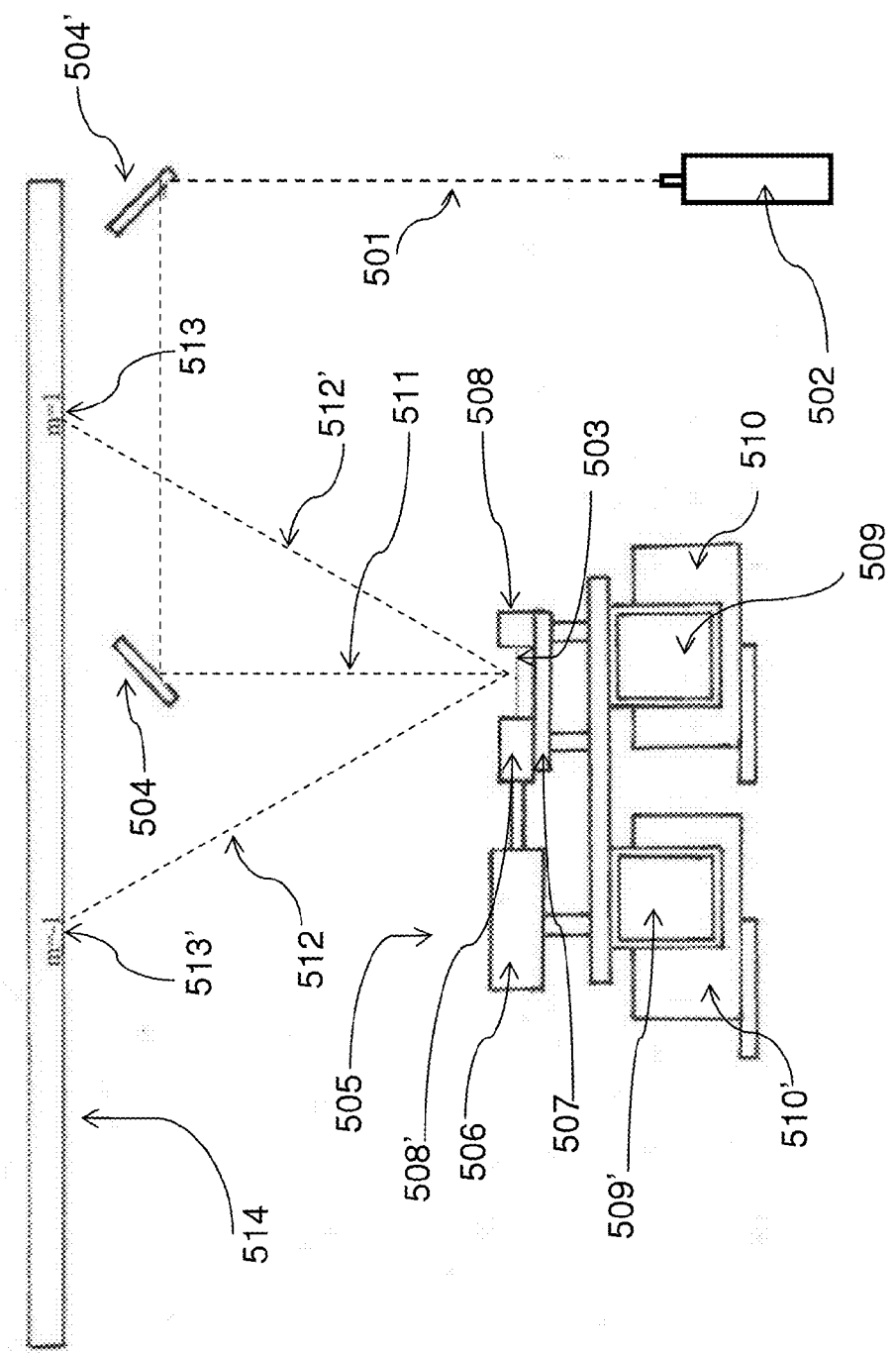
FIG. 5 shows, schematically, a system for the evaluation of the optical properties of gratings.

Before use for evaluating stretchable gratings, the proper functioning of the apparatus shown in FIG. 5 may be checked by measuring a planar rigid grating of known and well-defined geometry, such as a rigid grating used as master for the molding process of the elastomeric grating.

Another indication of the optical quality of a grating, that can be obtained with the setup of FIG. 5, is the measure of the solid angle Ω underlying the diffracted spot, defined by equation 2:

$$\Omega = A/R^2 \qquad \text{(eq. 2)}$$

where A is the area of the diffracted spot and R the distance of the spot from the grating. A low value of Ω implies a sharp spot and thus a good optical quality of the grating.

Thanks to the elastic nature of the support, and the possibility to fabricate devices on supports with low thicknesses (down to few micrometers), the stretchable and deformable reflective gratings of the invention are highly conformable and can take complex shapes, or be applied to surfaces with complex shapes; for instance, an elastomeric reflective grating of the invention may be attached to the inner side of a concave cylindrical surface; this does not exhaust all the possible shapes the device of the present invention can take or be applied to.

Other optical elements produced according to the invention can be used to modify the wave front of incident light; for instance, such modification can be obtained with a "stretchable and deformable mirror" produced by SCBI, applied to a suitable planar surface or a surface deformed in a suitable shape (for instance, a spherical concave or convex support) with various methods known by those skilled in the art, to modify the wave front of the incident light beam in both the horizontal and vertical directions and to respectively focus or defocus the exiting light beam (or exiting diffracted light beam if a grating is used).

Different optical elements produced according to the invention can be combined obtaining complex optical systems.

Finally an actuating system known by those skilled in the art can be applied to the mirrors or gratings of the invention in order to continuously change the shape of these devices according to the particular wave front shape of the incident light beam. This last configuration can be used, for example, in adaptive optics.

The advantage of using stretchable and deformable optical elements for focusing/defocusing, diffract and modify the wave front of an incident light beam is clear. By using identical stretchable and deformable elements applied to different surfaces with different shapes or deformed in different ways it is possible to modify arbitrary incident light beams without fabricating different optical elements. Moreover the fabrication of complex shaped supports with a cylindrical (or spherical) symmetry is much easier and cheaper than fabricating analogous complex shaped mirrors or, worse, gratings. The use of stretchable and deformable fully or partially reflective optical elements finally avoids the use of transmission classical optical elements (like, for example, lens or transmission gratings) that can absorb and/or refract light, thus negatively modifying the wave front and the spectrum of the incident light beam.

The invention will be further illustrated by means of the following examples.

Example 1

This example refers to the production of a molded elastomeric grating.

Following the method illustrated with reference to FIG. 1, a not yet cross-linked liquid PDMS polymer is prepared by mixing a dose of approximately 30 grams of a polymer base of Sylgard 184 (Dow Corning Corporation) with the appropriate curing agent in 10:1 ratio. The mixture is placed in a chamber evacuated by means of a membrane-type vacuum pump, and maintained at a pressure of about 13 Pa for 30 minutes, in order to expel any air bubbles. This process leads to the formation of the "liquid PDMS". The "liquid PDMS" thus obtained is then poured on the grooved surface of a rigid grating having a grooves density of 1200 lines/mm. The difference in height between the upper parts (crests) of the lines of the rigid grating and its lower parts (valleys) is of 50 nm. The rigid grating has a size of 3×3 cm. The thickness of the liquid PDMS over the rigid grating is of about 1 mm.

The "liquid PDMS" is then allowed to polymerize keeping the assembly formed with the rigid grating at rest at room temperature in a clean, dust-free environment, for 48 hours. After the polymerization, the PDMS has a transparent rubber-like aspect and is removed from the rigid grating. The face of the molded PDMS grating in contact with the rigid grating reproduces the periodic structure of the latter.

Figure 11:
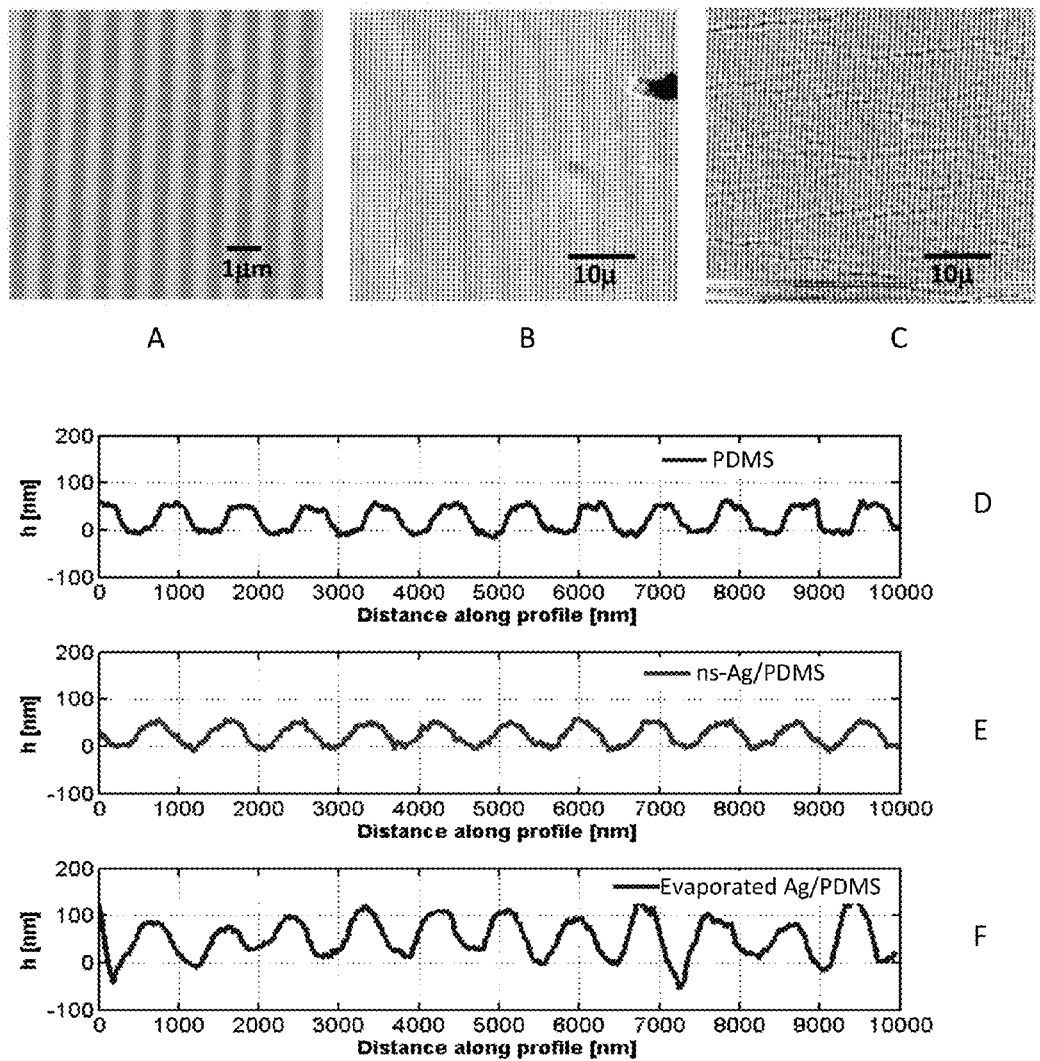
FIG. 11 shows height maps of a bare elastomeric support, on a grating of the invention and on a grating of the prior art, and graphs of the profile of the surface of these samples taken with an atomic force microscope (AFM)

A height map of the bare molded PDMS grating thus obtained is taken by means of an atomic force microscope (AFM); the resulting image is shown as inset A in FIG. 11. An AFM single-line scan of the same surface is obtained along a line orthogonal to the grooves of the bare molded PDMS grating; the resulting graph is shown as inset D in FIG. 11.

Example 2

This example refers to the metallization of the bare molded PDMS grating obtained in Example 1 according to the first embodiment of the invention.

The metallization of the molded PDMS grating obtained in Example 1 is performed by the SCBI technique. The experimental setup is as previously described with reference to FIG. 2. In this system, the cavity (201) of the source has a volume of approx. 2.5 cm$^3$; inside the cavity, and orthogonally to it, is present a rod of silver of 99.99% purity with a diameter of 2 mm, which is rotated at 4 rpm; Ar of 99.9999% purity is injected into the cavity by a solenoid valve (203) at an inlet pressure equal to 40 bar. The anode of the source is constituted of a perforated copper disk with a diameter of 2 cm with a 1 mm hole at the centre. The nozzle between the cavity and the expansion chamber (204) is a 2 mm orifice, and downstream from this there is a collimator with aerodynamic lenses, composed of four stages in sequence, each of which is in its turn composed of a hollow metal cylinder with an inside diameter of 10 mm and a height of 28 mm; the stages are interconnected with each other by aerodynamic lenses constituted of steel disks with a diameter equal to that of the hollow cylinders and with a central hole 2 mm in diameter; the last stage is in its turn connected to the expansion chamber via another aerodynamic lens with an orifice with a diameter of 1 mm.

A pumping system (206), composed of a "Roots" pump and a turbomolecular pump, brings the pressure in the expansion chamber to about $9.3 \times 10^{-5}$ Pa.

The procedure for production and implantation of the electrically neutral nanoclusters is then started, operating in pulsed regime with a frequency of 5 Hz. At each cycle the solenoid valve is opened for 300 µs and, after a delay time of 0.43 ms from valve opening, a voltage of 850 V is applied between the anode and the cathode of the source (the silver rod) for a time of 80 µs. A mixture of argon and silver nanoclusters is generated, having a pressure of approximately 0.27 bar. Owing to the pressure difference between the cavity of the source and the expansion chamber, the mixture is accelerated towards the latter, producing a beam of silver nanoclusters with an average velocity of about 1000 m/s.

The expansion chamber communicates with the deposition chamber (209) via a skimmer with a 3 mm hole at the vertex. The deposition chamber is connected to a second pumping system (210), similar to the previous one, which maintains an average pressure of about $6.7 \times 10^{-3}$ Pa inside the deposition chamber during operation of the source.

In the deposition chamber, orthogonally to the beam axis and turned towards the nanocluster beam, there is a sample holder of 10 cm×10 cm on which, before evacuating the deposition chamber, the molded PDMS grating produced in Example 1 is positioned. The sample holder is connected to a remote-controlled motorized system, which is able to move said sample holder (and consequently the molded PDMS grating) in the two directions orthogonal to the axis of the cluster beam and enabling to perform "rastering" over an area of 8 cm×8 cm, exposing to the nanocluster beam the complete region of the sample holder where the molded PDMS grating is positioned.

Before and during exposure, the molded PDMS grating is maintained at room temperature (about 25° C.). The exposure time is 90 minutes.

A silicon substrate of dimensions 5 mm×5 mm, half-masked with an aluminum foil, is placed on the sample holder next to the molded PDMS grating, and it is intercepted by the same nanoparticle beam (by moving the sample holder) as the molded PDMS grating; an equivalent thickness of 89±2 nm of silver nanoclusters is measured. The amount of silver nanoclusters implanted in the PDMS support in this example dives rise to a fully reflective surface.

The thus obtained metalized grating is subjected to the same morphological characterizations as the base PDMS grating obtained in Example 1, namely, two AFM measures; the height map and the surface profile obtained by single-line scan resulting from the AFM measure on this sample are represented in FIG. 11 as insets B and E, respectively.

Example 3 (Comparative)

This example refers to the metallization of a bare molded PDMS grating according to a method of the prior art.

A second bare molded PDMS grating is produced following the procedure of Example 1. This support is metalized by evaporation. The bare molded PDMS grating is positioned on a sample holder together with a little silicon substrate (5 mm×5 mm) half-masked with a foil of aluminum for the measurement of the equivalent thickness, and placed in the vacuum chamber of an evaporation apparatus in front of a molybdenum crucible filled with 2 grams of silver pellets. The vacuum chamber is then evacuated by a diffusion pump down to a pressure of $4 \times 10^{-3}$ Pa. The crucible is heated by Joule effect with a direct current of about 70 A and the evaporated silver deposited on the bare molded PDMS grating and the silicon sheet for about 10 minutes. By measuring the height step between the non-deposited silicon and the deposited side, an equivalent thickness of 60 nm is obtained.

The thus obtained metalized grating is fully reflective and subjected to the same morphological characterizations as the base PDMS grating obtained in Example 1, namely, two AFM measures; the height map and the surface profile obtained by single-line scan resulting from the AFM measure on this sample are represented in FIG. 11 as insets C and F, respectively.

Example 4

This example refers to the production of a partially reflective grating according to a first variant of the second embodiment of the invention.

A flat PDMS support is produced by casting "liquid PDMS" (produced as described in Example 1) onto a glass slide with dimensions of 1 cm×1 cm; after polymerization, the obtained PDMS slab has a transparent rubber-like aspect and can be removed from the planar support as described in example 1.

The thus obtained PDMS support is positioned on the sample holder of the SCBI apparatus described with reference to FIG. 2. A stencil mask is interposed between the beam and the PDMS support, at a distance of 0.5 mm from the latter. The mask is a TEM grid (G2786N grid from Agar Scientific) with square apertures having an 8.5 µm side and spaced apart 3 µm. The nanocluster deposition is then started following the same procedure described in Example 2, with the only differences that in this case a gold rod with a diameter of 3 mm is used, and the deposition lasts 60 minutes; an equivalent thickness of about 50 nm is measured.

Figure 14:
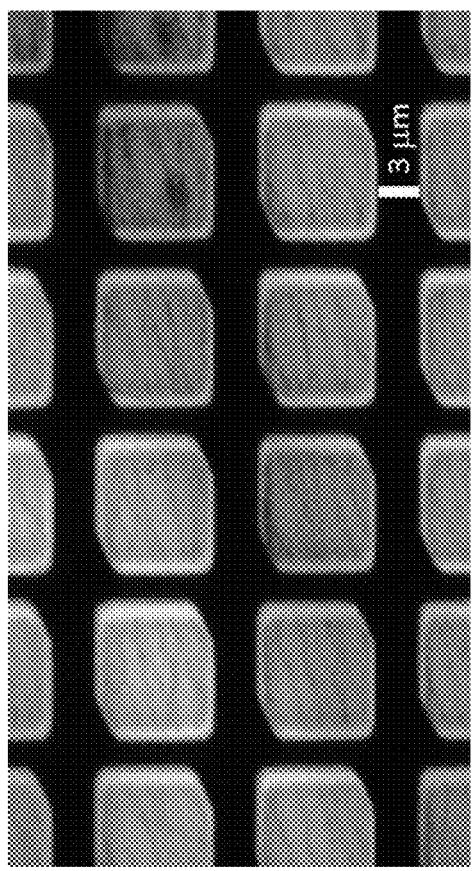
FIG. 14 shows a microphotograph of another grating of the invention.

The thus obtained sample is observed with an optical microscope in reflection; the microphotograph taken with the microscope is reproduced in FIG. 14. The visibility of the square pattern with the reflection optical microscope is a confirmation of the good reflection of the illuminating light by the implanted gold squares. As a comparison, the bare, non-implanted PDMS appears black because of its transparency and lack of illuminating light reflection. As it can be clearly seen, thanks to the high collimation of the beam of nanoclusters in SCBI, the apertures of the mask are perfectly replicated on the PDMS film with a sub-micrometric resolution.

The stretchable and deformable SCBI grating obtained with this procedure is semi-reflective because of the non-implanted, bare PDMS regions between the gold-patterned PDMS.

Example 5

This example refers to the optical characterization of a grating of the invention.

The optical properties of the sample produced in Example 2 are studied using the experimental set up described with reference to FIG. 5.

Before using this experimental setup for evaluating the samples produced in the examples, its proper functioning is checked by measuring, as reference, the optical properties of the planar rigid grating used as master in Example 1; this grating has a groove periodicity, known by the producer data, of 1200 lines/mm, corresponding to a pitch distance of 833 nm. The diffraction angle measured on this reference sample by the setup of FIG. 5 results of 832±3 nm, fully compatible with the nominal value; this proves that by means of the adopted optical setup it is possible to correctly and precisely determine the pitch distance of a planar diffraction grating.

Figure 6:
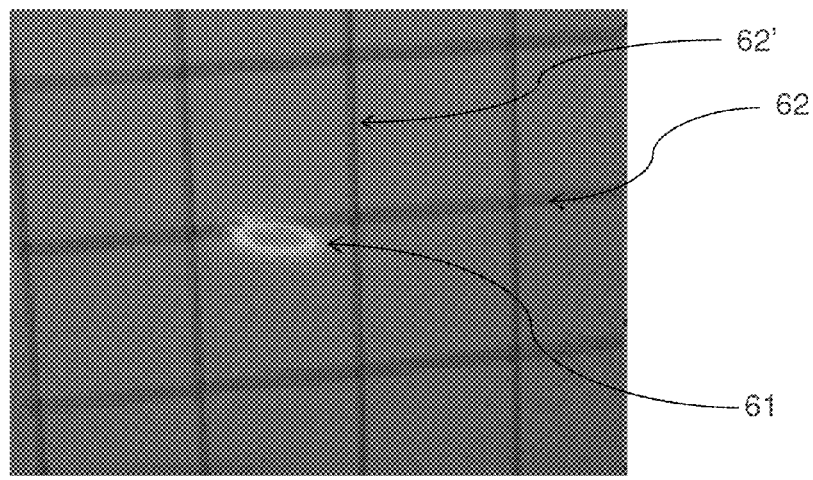
FIG. 6 shows a spot of light diffracted by a grating of the invention.

With the experimental setup described with reference to FIG. 5, the optical performances of the grating produced in Example 2 were studied. FIG. 6 shows one of the diffraction spots (61) obtained using said grating on a graduated screen placed at a distance of 40 cm from the grating (both the horizontal (62) and the vertical parallel black lines (62') of the screen grid have a separation of 2 cm). as can be seen, the spot is narrow and well defined, resulting in a precise and reliable measure of its position and therefore of the diffraction angle. The grating is mounted in the optical set up in such a way that its grooves are aligned on the vertically direction; as a consequence, the diffraction spots (61) are on the two opposite sides in the horizontal direction with respect to the incident light beam, as expected.

Figure 7:
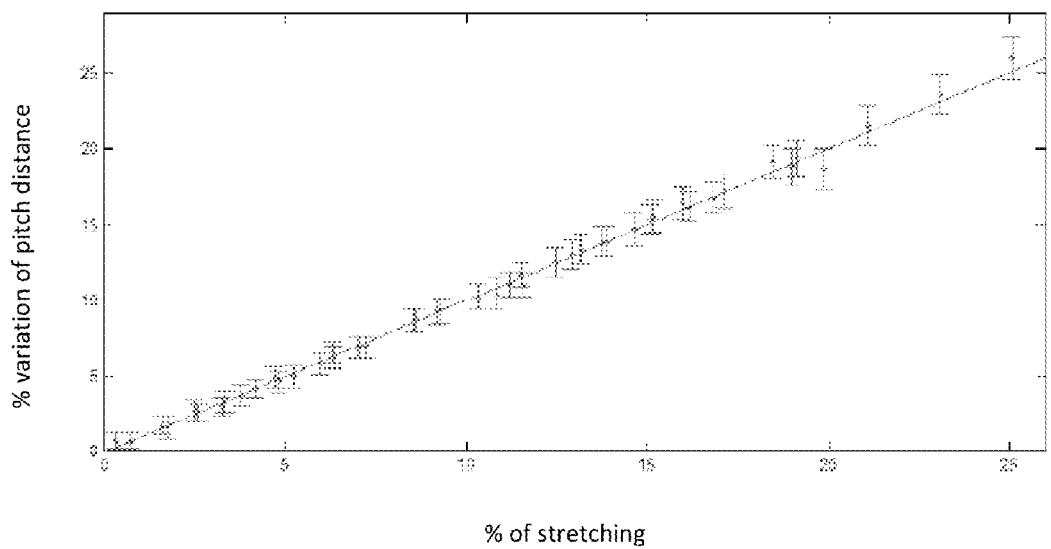
FIG. 7 reports a graph demonstrating the excellent quality of the optical properties of a grating of the invention upon stretching.

By means of the stretcher 505, the grating object of the test is strained in the direction perpendicular to the grooves, while maintaining constant the direction of the incident laser beam 511. The displacement of spots 61 is detected and measured constantly during the test. FIG. 7 is a graph reporting the "percentage of variation of the pitch distance" (obtained by measuring the diffraction angle and using equation 1) as a function of the applied "% of stretching". As shown in the graph, the experimental data clearly follow a linear trend. By performing a linear fit of the data, a coefficient of optical stretchability equal to 1.003 is obtained (with a linear regression coefficient $r^2$=0.998).

Remarkably, the capability of the reflective grating of the invention to disperse light is evident already to the bare eye: when it is illuminated by visible light it disperses the spectral components in the same manner as a standard rigid grating.

This example clearly demonstrates the good optical performances achievable with a grating obtained according to the method of the invention, and the possibility of simply changing its optical functionality by varying the applied strain. Remarkably, such grating can be stretched up to 25% keeping its optical functionality.

Example 6 (Comparative)

This example refers to the optical characterization of a grating of the prior art.

Figure 8:
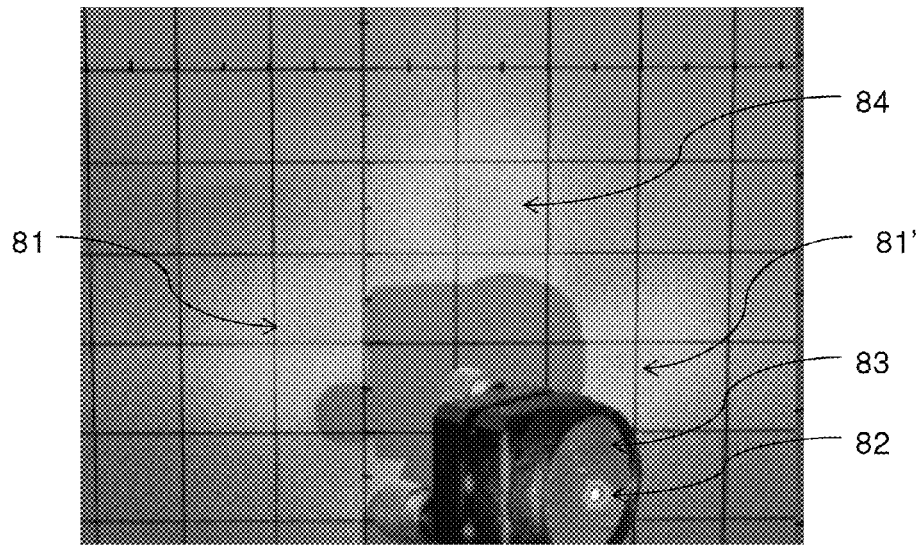
FIG. 8 shows the spots of light diffracted by an elastic grating of the prior art.

The grating produced in Example 3 is measured following the same procedure of Example 5. FIG. 8 shows the spot configuration obtained after the stretching of this grating. As in Example 5, also in this case there are the two diffraction spots, 81 and 81', positioned laterally on the two sides of the incident light beam 82 and visible on the mirror (83), but the spots are much larger and much less defined than the ones obtained with grating of the invention. As known, this can be due to the formation of a larger number of cracks parallel to the periodic structure. Furthermore, beyond the two lateral spots, also two vertical spots (84) positioned at the opposite sides of the incident light beam (82) are present (only one of these two vertical spots is visible in FIG. 8). As known by those skilled in the art, the vertical dispersion of these spots suggests the presence of an additional horizontal periodic structure in the grating surface, perpendicular to the molded grooves of the device, probably due to the formation of cracks also on the horizontal direction (i.e. parallel to the stretching direction) having a certain periodic distance. The presence of many perpendicular cracks may cause arising of aberrations in the diffracted light, with the appearance of secondary diffraction beams and so negatively altering the functionality of the reflective grating.

Figure 9:
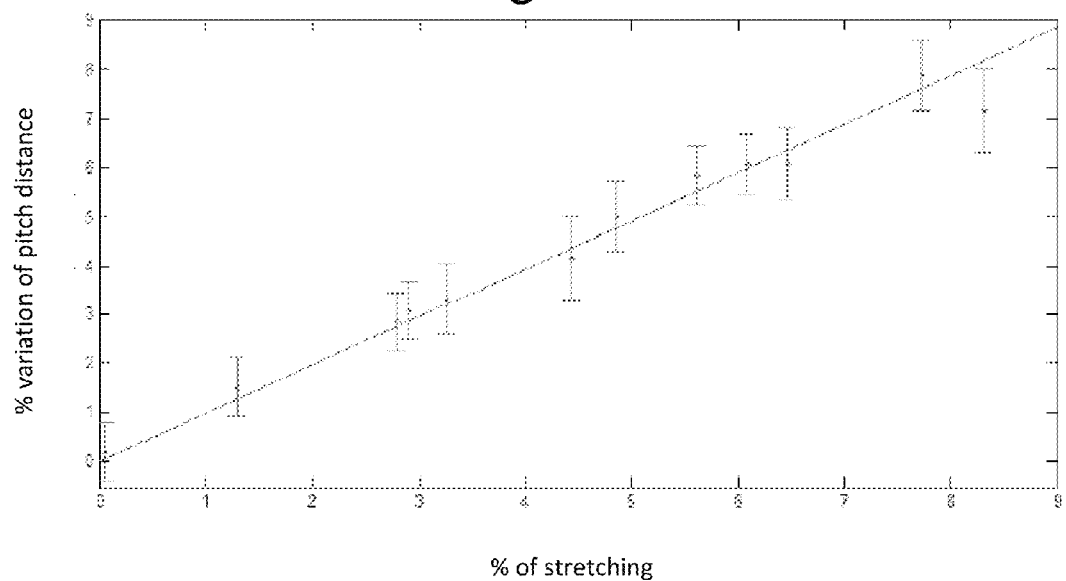
FIG. 9 reports a graph demonstrating the relatively poor quality of the optical properties of a grating of the prior art upon stretching.

As shown in FIG. 9, from the quantitative analysis of the linear fit of the experimental data obtained following the same procedure explained in Example 5, a coefficient of optical stretchability of m−0.984 0.984 (with a linear regression coefficient $r^2=0.98$) $r^2=0.981$ is obtained. These results confirm the poorer optical performances of this grating compared to those obtained with the grating produced with the method of the present invention.

Example 7

In this example, another comparison of the optical properties of a grating produced according to the invention and of a grating produced according to the prior art is performed.

During the tests carried out in Examples 5 and 6, is measured the value of the solid angle Ω (in steradians) underlying the diffracted spots as a function of the stretching percentage at the first stretching cycle of the grating of the invention (Example 5) and of the grating of the prior art (Example 6); the results are reported in graph in inset a of FIG. 10; as it is clearly observed from the graph, the grating produced according to the prior art (evaporation) presents larger values for the solid angle, hence wider diffracted spots, witnessing the major deterioration of the reflecting layer of this grating compared to the grating produced by SCBI.

The same comparison is performed after 1000 stretching cycles of the two gratings. The values of solid angle Ω measured during the 1000th elongation cycle versus the % of stretching is reported in inset b of FIG. 10. As can be seen the grating of the invention maintains a clear advantage over the grating of the prior art. This means that grating of the invention is more reliable than one of the prior art in optical applications in which sharp spectral lines are required or in which image formation phenomena are involved.

Example 8

This example refers to the optical characterization of a grating of the invention.

Figure 15:
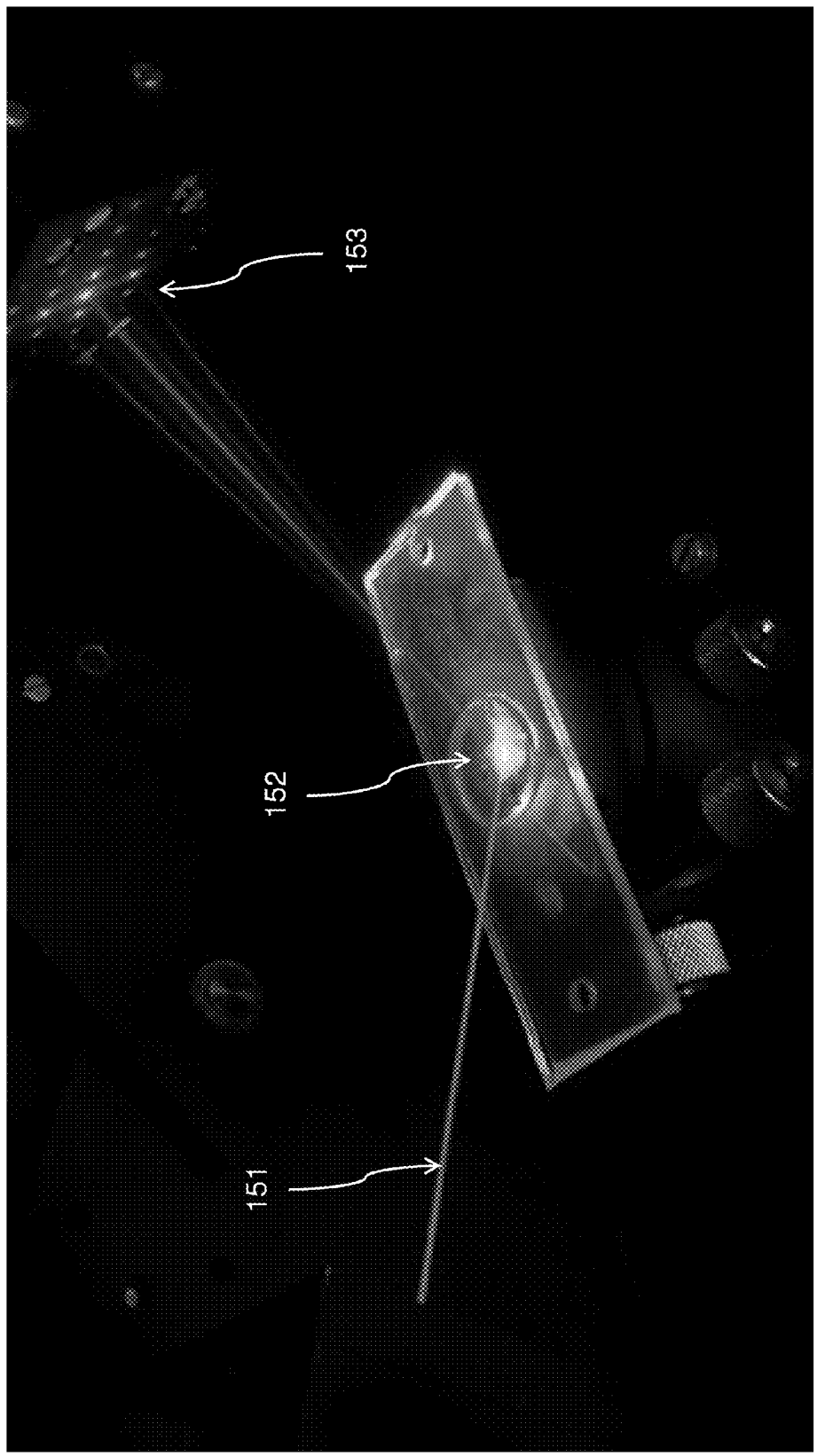
FIG. 15 shows the light diffraction pattern of a grating of the invention with a square pattern of reflecting dots.

The diffraction pattern generated by the grating produced in Example 4 (with square dots, FIG. 14), is tested with a monochromatic light beam (He—Ne laser, wavelength 632.8 nm). Referring to FIG. 15, the incident laser beam 151 hits the grating 152 and is diffracted in the two orthogonal directions, as expected for a square grating. The diffraction pattern (153) is clearly visible on the screen and at least 4 orders of diffraction are visible in the horizontal direction and at least 2 orders of diffraction are visible in the vertical direction.

Example 9

This example shows the optical properties of a grating of the invention when applied onto a non-planar surface, compared to those of a grating of the prior art.

Figure 16:
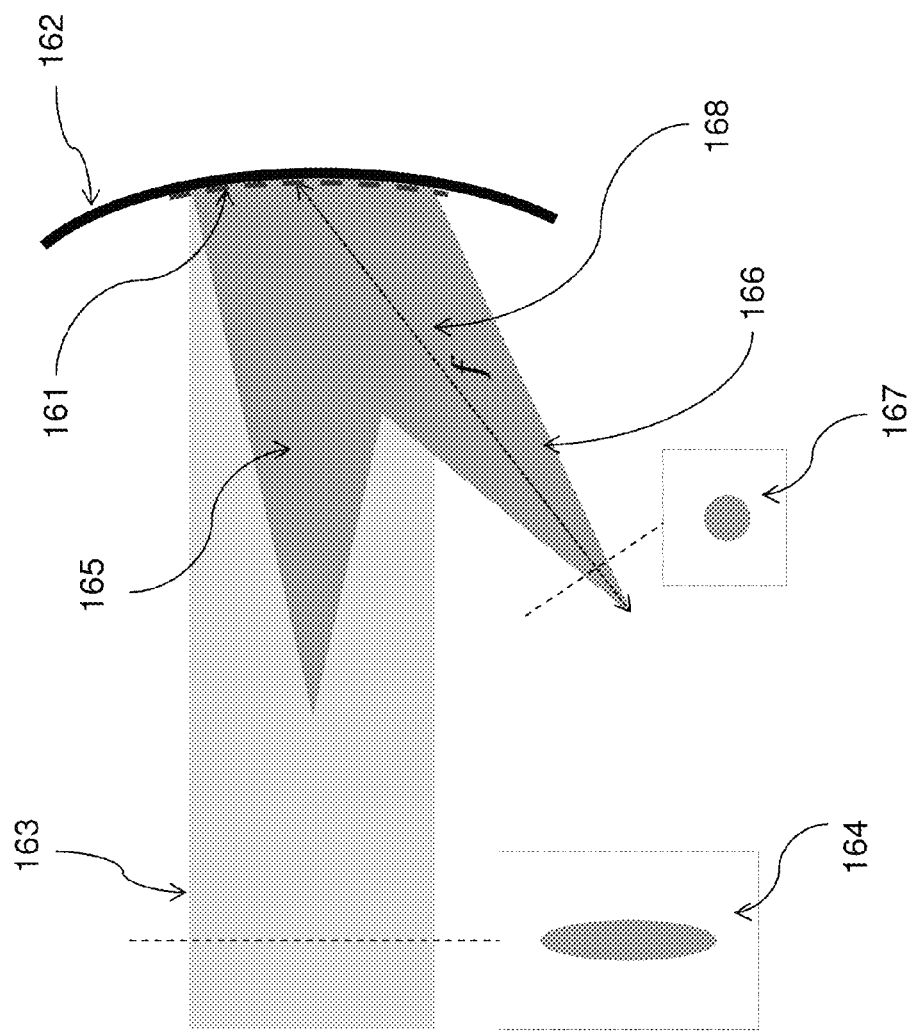
FIG. 16 schematically represents the diffraction properties of a grating of the invention applied onto a non-flat surface.

Referring to FIG. 16, a grating of the invention, 161, produced as described in Example 2, is applied to the non-reflective inner surface of a concave cylindrical support, 162; the grating is applied to said surface with the back side of the elastomeric support (opposite to the metalized side) in contact with the cylindrical surface; in this configuration the incident light does not pass through the elastomeric support, thus avoiding absorption and/or refraction. The incident light beam, 163, is astigmatic in the vertical direction, with an incident light beam section as shown at 164. Grating 161 diffracts the incident light beam to the orders allowed by the pitch of the grating, as known by those skilled in the art. In the drawing the $0^{th}$ (165) and $1^{st}$ (166) orders exiting light beams are sketched. Considering the $1^{st}$ diffraction order, the cylindrical shape of grating 161 maintains the diffracted light beam (166) unchanged in the horizontal direction, but focuses it in the vertical direction, as represented by the section of the diffracted light beam shown at 167.

In order to verify the quality of the curved grating as cylindrical mirror, the focal distance (168) between the grating illuminated with monochromatic light and the focal point of the $1^{st}$ diffraction order is measured and compared to the theoretical value obtained from the following equation:

$$f = -R \cos^2\beta/(\cos\alpha + \cos\beta)$$

Where f is the focal length, R is the radius of curvature of the cylindrical support, α and β respectively the incident and diffraction angles respect to the normal direction of the grating.

The results confirm an agreement between the experimental and the theoretical values within an error below 10%.

The same measures are performed with a grating of the prior art (produced by evaporation) applied to the same cylindrical surface and, as expected, the agreement between the experimental and the theoretical focal distance is much worse (error much higher than 10% and non repeatable measures). This disagreement in the case of the prior art grating is due to the cracking of the rigid metal layer that is not conformable with the curved surface to which the grating is applied and to the mismatch between the elasticity of said metal layer and of the elastomeric support.

These quantitative results confirm the better optical quality of the reflection grating produced by SCBI according to the invention compared to prior art grating upon deformation, as well as the ability of a curved grating of the invention to concentrate light, thus avoiding the use of more complex optical systems made of, for example, a transmission grating (through which the incident light beam passes, undergoing absorption and refraction) as dispersive element and a cylindrical mirror as focusing element.

The cylindrical shape that the grating of the invention is able to take allows reflecting and to add or remove astigmatism to the diffracted light beams.

Example 10

This example shows the capability of a combination of stretchable and deformable optical elements produced according to the invention to disperse, focalize and modify the wave front of an arbitrary incident light beam.

In this example, by "stretchable and deformable SCBI mirror" is meant a planar PDMS support on a flat surface of which is present a layer of homogeneous thickness produced by means of SCBI with reflective metals (for example silver, platinum, gold or aluminum) in order to make the surface reflective.

Figure 17:
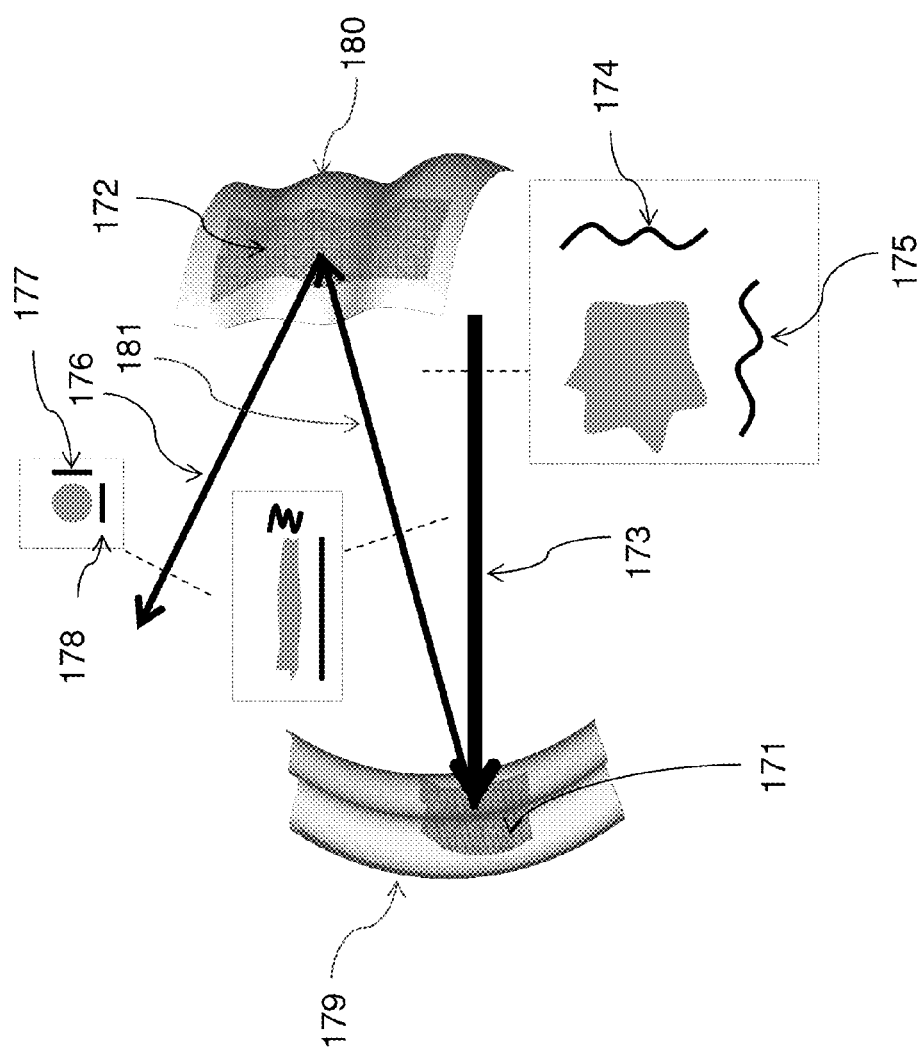
FIG. 17 schematically represents the optical properties of a system comprising two different optical elements of the invention.

Referring to FIG. 17, a system comprising a curved "SCBI grating" (171) and a "stretchable and deformable SCBI mirror" (172) is considered. The aim of such a system is to diffract an incident light beam (173) with arbitrary wave front modulations in both the vertical (174) and horizontal (175) directions, to focalize and to correct the aberrations by properly shaping the emerging light beam (176) wave front both in the vertical (177) and in the horizontal (178) directions. Here the terms "vertical" and "horizontal" are relative to the orientation of elements and beams in FIG. 17. For the focusing properties, grating 171 is applied to a substantially cylindrical concave (179) support with a horizontal rotation axis in order to focalize the incident light beam in the vertical direction while the "stretchable and deformable SCBI mirror" is applied to a substantially concave cylindrical support with a vertical rotation axis (180) in order to focalize the diffracted light beam (181) coming from the grating in the horizontal direction. In order to diffract the incident light beam (173) in the vertical plane, the grating is applied to support 179, for example, with the grooves in the horizontal direction, following the procedure described in the previous example. Finally the incident light beam wave front is modified by a more complex and well-determined shape of the two cylindrical supports (179, 180) in the direction perpendicular to their cylindrical curvature, modifying respectively the wave front in the horizontal and in the vertical directions. The fabrication of such supports (179, 180) is easily made by those skilled in the art, for example with a common turning lathe or, more easily, with a CNC machine.

Discussion of Morphological and Optical Characterizations

Morphological characterizations before and after stretching and optical behavior characterization during stretching have been made on the samples produced in the Examples reported above, studying in particular the modification of the pitch distance and the diffracted light spot shape during stretching.

Due to the small dimensions of the grooves of these gratings the morphology was studied by means of an atomic force microscope (AFM). The resulting characterizations are shown in FIG. 11. In particular, insets (A), (B) and (C) in FIG. 11 show the comparison between the bare molded PDMS grating, a stretchable and deformable SCBI grating produced according to the invention (first embodiment) and according to the prior art (metallization by evaporation).

The first inset A represents the AFM height map of the bare molded PDMS grating; the periodic structure of the molded surface is evident. This can be clearly seen also in the plot of a single scan line profile, shown in inset D, that highlights the quasi-sinusoidal profile of the periodic structure. From the analysis of the AFM map (inset A) a pitch distance of 850±28 nm is determined, that is fully compatible with the pitch distance of 833 nm (grooves density of 1200 lines/mm) of the planar rigid grating used as master for the molding process. Furthermore, as it can be clearly observed from the single line scan profile acquired orthogonally to the grooves of the grating, shown in the inset D, the peak-to-valley height of the profile for the bare PDMS grating is 55.0±1.4 nm.

The same measurements are performed on the grating of the invention produced in Example 2. The AFM height map of the specimen obtained in Example 2 is shown in FIG. 11, inset B. The obtained map is very similar to the one obtained with the bare molded PDMS grating (A). The quality of reproduction of the support profile obtained with this metallization is evident also in the graph, inset E in FIG. 11, of a single line scan profile taken orthogonally to the grooves of the grating; indeed, the profile of line scan (E), very similar to the one relative to the bare molded PDMS grating (D), shows a pitch distance of 860±33 nm, that is fully compatible with the pitch distance of both the rigid grating used as master for the molded PDMS grating and the bare molded PDMS grating itself; this sample shows a peak-to-valley height of 46.2±0.1 nm.

Finally, the same measurements are performed on the grating obtained in Example 3, according to the prior art method of evaporation. The AFM height map of this specimen, inset C in FIG. 11, is quite different from the ones relative to the previous two cases (insets A and B). A periodic structure is still present, but many cracks, both parallel and perpendicular to the periodic structure of the grating, are observed. The AFM single line scan profile, inset F in FIG. 11, confirms the relevant morphological differences in comparison with the line scan profiles D and E, showing that the profile of the starting bare molded PDMS grating is not maintained after the coating by thermal evaporation process. These results are also confirmed by a quantitative analysis: the pitch distance for the grating obtained in Example 3 is still similar (854±31 nm) to that of the bare molded PDMS grating, but the average peak-to-valley height is much higher (81±7 nm) than in the case of the bare molded PDMS grating.

Figure 12:
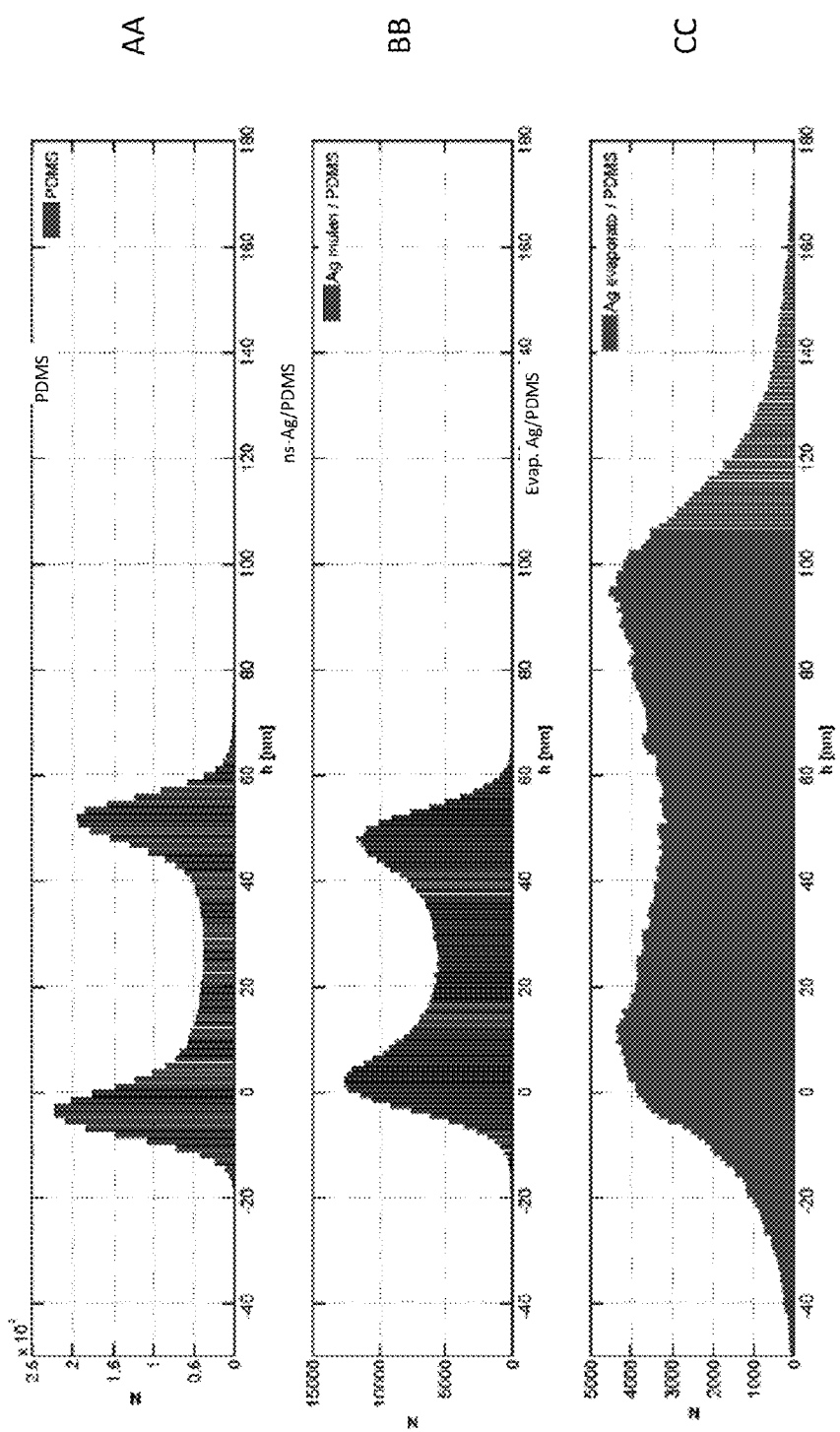
FIG. 12 shows histograms providing a measure of the quality of the same gratings measured in FIG. 11.

The regularity of the periodic structure of the three gratings can also be studied, as known in the art, by the height histogram of their profiles. In FIG. 12 are shown the height histograms relative to the bare molded PDMS grating (AA), to the grating obtained in Example 2 according to the invention (BB), and to the grating obtained in Example 3 according to the prior art (CC).

As expected, the height histogram relative to the bare molded PDMS grating (AA) shows two well defined, narrow and separated peaks, indicating a well defined periodic structure. In the height histogram relative to the grating of the invention (BB), two well defined, narrow and separated peaks are still present, having only a slightly larger width than in the case of the bare molded PDMS grating (AA). Finally, in the height histogram relative to the grating of the prior art (CC), the two peaks show a remarkable broadening (i.e. the strong increase of their widths), becoming poorly distinguishable. This demonstrates the large irregularity of the periodic structure of a grating obtained by metallizing an elastomeric surface by evaporation, that, as known by those skilled in the art, determines poor optical performances.

The samples produced in Examples 2 and 3 are further evaluated by inspection with an optical microscope.

FIG. 13 shows the obtained optical images of the surface of the grating of Example 2 (left) and of the surface of the grating of Example 3 (right), after the stretching of both devices. As shown in the left image of FIG. 13, the grating of the invention, 131, presents few cracks (132, 132'), on the superficial layer that do not affect significantly the optical behavior of the device. Larger and more evident cracks (133, 133', 133") are instead present in the surface of the grating obtained by evaporation (134), which largely affect the optical behavior of this device (in particular, for example, reducing the sharpness of the diffracted spots). Beyond these vertical cracks, parallel to the grating grooves direction, it is possible to see in also many horizontal cracks (135, 136), caused by the stretching of the rigid metal evaporated layer and orthogonal to the grating grooves direction. The direction and regularity of these horizontal cracks are responsible for the vertically-aligned diffraction spots (84) observed in the diffraction pattern shown in FIG. 8, obtained with the grating produced by evaporation. These results demonstrate how the low quality performances (cracks formation, delamination, and bad reproducibility of the molding pattern, . . . ) of the metallic layer formed by means of a standard metallization (such as evaporation) on a molded elastomeric support lead also to a poor optical functionality of the grating.

The optical measurements discussed above hence confirm the better optical behavior of a molded elastomeric (preferably produced on PDMS) fully or partially reflective grating metalized through SCBI compared to one obtained with a standard metallization technique (e.g., by evaporation). Defects and broadening of the diffracted spots are minimized and the formation of horizontal cracks in the reflective surface of the elastomeric (preferably, PDMS based) grating is avoided by using SCBI as metallization technique.

Thanks to the supersonic cluster beam implantation process, the stretchable and deformable fully or partially reflective optical elements (in particular, gratings) obtained in the invention show no deterioration of the polymer composing the molded PDMS grating, since the whole process, in this preferred embodiment of the present invention, is performed at room temperature. Furthermore, thanks to the "rastering" process, it is possible to implant the optical active face (i.e., the molded face) of the elastomeric support with metal nanoclusters in a very homogeneous way.

From the results presented above it is clear that the use of nanoclusters carried and implanted in a supersonic regime allows to reproduce and does not alter the profile of the bare elastomeric support, be this flat or molded. This is uniquely due to the use of SCBI and it is not achievable by using for example metallization of atoms or other species produced and manipulated in effusive regime. The advantages and unicity of using SCBI for the production of reflective layers on stretchable and deformable optical devices (as for instance a stretchable and deformable reflective diffraction grating) are therefore evident. The extremely high fidelity of maintenance of the surface profile, passing from the bare elastomeric support to the metalized device together with the combination of reflectivity, deformability and stretchability (and possibly conductivity) of the nanocomposite layer, is unique of this technique and could not be foreseen beforehand, not even from the contents of the previous patent application WO 2011/121017 A1.

The invention claimed is:
1. A method for the production of a fully or partially reflective stretchable and deformable optical element comprising a diffraction grating, said method comprising:
   providing an elastomer support;
   implanting in at least one surface of the elastomer support, by a technique of "Cluster Beam Implantation", neutral nanoclusters of a material selected among one or more metals, their alloys, their oxides or mixtures thereof, to form a nanocomposite layer of said neutral nanoclusters in said elastomer support, thereby producing the fully or partially reflective stretchable and deformable optical element comprising the elastomeric diffraction grating.

2. The method according to claim 1, comprising the phases of:
   creating a beam of neutral nanoclusters of said material, in which said nanoclusters have a mean velocity between 100 and 10000 m/s and size less than 50 nm;
   directing said beam onto said surface of the elastomeric support.

3. The method according to claim 1, wherein said one or more metals are selected from the group consisting of Au, Ag, Pd, Pt, Cu, Ti, Fe, Ni, Cr, Co, Nb, Zr, Al, V, Zn, Mo, W, Pb, Sn, Hf and Ir.

4. The method according to claim 1, wherein said elastomer support comprises a material selected among polysiloxanes, silicone rubbers, latex, thermoplastic elastomers, photoresists, polyurethane, polyamide, polyimide, fluoropolymers, polyvinyl pyrrolidone, polyethylene glycol, polyethylene oxide, polyvinyl alcohol or hydrogels.

5. The method according to claim 4, wherein said elastomer support is polydimethylsiloxane (PDMS).

6. The method according to claim 1, wherein said nanoclusters have size between 1 and 20 nm.

7. The method according to claim 1, wherein during the implantation of nanoclusters the elastomeric support is maintained at a temperature between −10° C. and 150° C.

8. The method according to claim 7, wherein said temperature is room temperature.

9. The method according to claim 1, wherein, after implantation of the nanoclusters in the elastomer support, the nanocomposite layer thus obtained is cured at a temperature from about 40° C. to about 120° C. for a period from about 0.3 hours to about 48 hours.

10. The fully or partially reflective stretchable and deformable optical element comprising the diffraction grating obtained according to claim 1.

11. The optical element comprising the diffraction grating according to claim 10 wherein the nanocomposite layer formed in the elastomer support is both fully or partially reflective and electrically conductive.

12. The optical element comprising the diffraction grating according to claim 10, wherein the nanocomposite layer formed in the surface of the elastomer support has a thickness comprised between 5 nm and 10 μm.

13. The optical element comprising the diffraction grating according to claim 12, wherein said nanocomposite layer has a thickness comprised between 10 nm and 1 μm.

14. The optical element comprising the diffraction grating according to claim 10, wherein the elastomer support has a molded surface with a shape corresponding to that of the diffraction grating, wherein said molded surface comprises the nanocomposite layer.

15. The optical element comprising the diffraction grating according to claim 10, wherein the elastomer support has a flat surface, wherein said flat surface comprises a discontinuous nanocomposite layer in the form of reflective "islands" positioned according to a geometrical pattern.

16. The optical element comprising the diffraction grating according to claim 10, wherein the elastomer support has a flat surface, wherein said flat surface of the elastomer support comprises: a first continuous nanocomposite layer, and a second discontinuous nanocomposite layer in the form of reflective "islands" positioned according to a geometrical pattern on said first continuous nanocomposite layer.

17. An optical system comprising at least the fully or partially reflective optical element comprising the diffraction grating of claim 10.

* * * * *

UNITED STATES PATENT AND TRADEMARK OFFICE
CERTIFICATE OF CORRECTION

PATENT NO. : 10,018,831 B2
APPLICATION NO. : 14/364672
DATED : July 10, 2018
INVENTOR(S) : Corbelli et al.

Page 1 of 1

It is certified that error appears in the above-identified patent and that said Letters Patent is hereby corrected as shown below:

In the Claims

Claim 17, Column 24, Line 63, insert --stretchable and deformable-- after the word reflective and before the word optical.

Signed and Sealed this
Twenty-fifth Day of June, 2019

Andrei Iancu
*Director of the United States Patent and Trademark Office*